(12) United States Patent
Shimizu et al.

(10) Patent No.: US 8,777,448 B2
(45) Date of Patent: Jul. 15, 2014

(54) LED LAMP WITH LIGHT-DIFFUSING END CAP

(75) Inventors: Hirotaka Shimizu, Kyoto (JP); Mitsunori Nagashima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 405 days.

(21) Appl. No.: 13/162,120

(22) Filed: Jun. 16, 2011

(65) Prior Publication Data

US 2011/0310604 A1 Dec. 22, 2011

(30) Foreign Application Priority Data

| | | |
|---|---|---|
| Jun. 17, 2010 | (JP) | 2010-137892 |
| Jun. 29, 2010 | (JP) | 2010-147460 |
| Sep. 14, 2010 | (JP) | 2010-205050 |
| May 17, 2011 | (JP) | 2011-110601 |

(51) Int. Cl.
*F21V 5/00* (2006.01)

(52) U.S. Cl.
USPC ............................. 362/235; 362/241; 362/800

(58) Field of Classification Search
USPC ......... 362/235, 241, 243, 247, 346, 607, 623, 362/800
See application file for complete search history.

(56) References Cited

FOREIGN PATENT DOCUMENTS

JP U-6-54103 7/1994

*Primary Examiner* — Joseph L Williams
(74) *Attorney, Agent, or Firm* — Hamre, Schumann, Mueller & Larson, P.C.

(57) ABSTRACT

An LED lamp includes a plurality of LED modules arranged in direction x, a tubular enclosure for housing the LED modules that is open at ends spaced from each other in direction x, and end caps respectively closing the ends of the tubular enclosure in direction x. Each of the end caps is configured to diffuse light from the LED modules while transmitting the light, and includes an emission surface for emitting light in a direction z perpendicular to direction x. This arrangement ensures that the LED lamp has a good appearance even when it is made long.

25 Claims, 25 Drawing Sheets

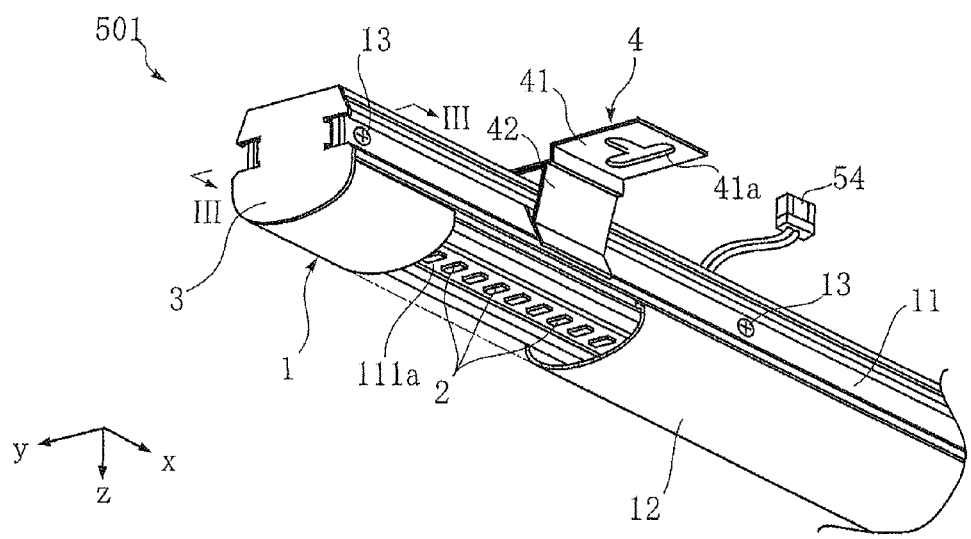
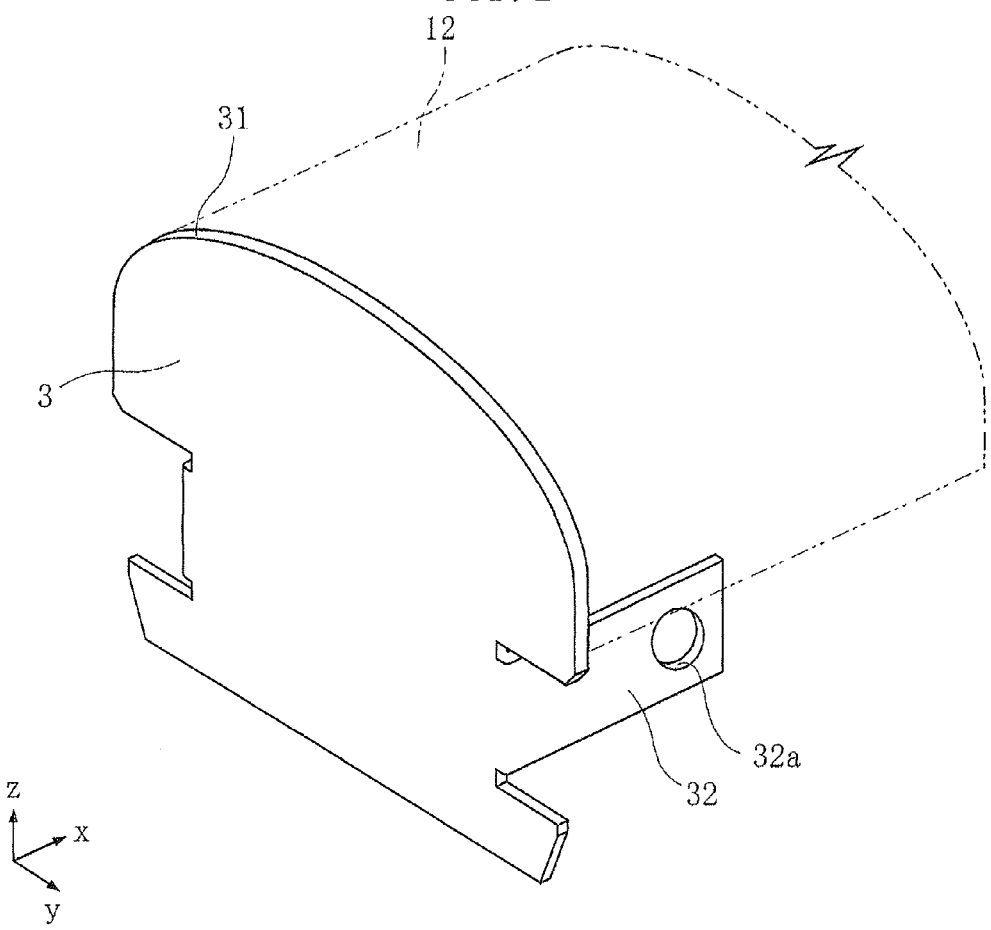

LED LAMP WITH LIGHT-DIFFUSING END CAP

BACKGROUND OF THE INVENTION

1. Field of the Invention

The present invention relates to an LED lamp, a lamp case for housing an LED lamp, an LED lighting apparatus using the same, and also to an LED module.

2. Description of the Related Art

FIG. 39 is a sectional view showing an example of conventional LED lamp (see JP-U-6-54103, for example). The LED lamp 900 shown in the figure includes a substrate 91 in the form of an elongated rectangle, a plurality of LED chips 92 arranged in a row on the substrate 91, a tube 93 housing the substrate 91, terminals 94, and a circuit 95 for turning on the LED chips 92. On the substrate 91 is formed a wiring, not shown, connected to the LED chips 92 and the terminals 94.

The LED lamp 900 is structured such that the LED chips 92 can be turned on when the terminals 94 are fitted into sockets for a fluorescent lamp attached to a ceiling, for example. Since the LED chips have a long life with low power consumption, the use of the LED lamp 900 instead of an existing fluorescent lamp is advantageous in terms of cost and effect to the environment.

However, since the terminals 94 are provided at the ends of the LED lamp 900 that are spaced in the longitudinal direction, when a plurality of LED lamps 900 are connected to each other in the longitudinal direction, light is not emitted from the joint portion where the terminals exist. Thus, a long lighting apparatus provided by connecting a plurality of LED lamps 900 has non-light-emitting portions or dark portions at regular intervals in the longitudinal direction, which gives an unfavorable impression to the user.

Moreover, the arrangement of the LED chips 92 in a row provides a sharp brightness distribution on each side of the row, which tends to cause a glare. Such a problem becomes more serious as the number of the LED chips 92 increases. Thus, it is difficult to achieve both of increased light emission amount and uniform brightness.

SUMMARY OF THE INVENTION

The present invention has been proposed under the circumstances described above. It is therefore an object of the present invention to provide an elongated LED lighting apparatus having a good appearance, an LED lamp that realizes such an LED lighting apparatus, and a lamp case suitable for housing the LED lamp. Another object of the present invention is to provide an LED module and an LED lighting apparatus capable of achieving uniform brightness while increasing the entire light emission amount.

According to a first aspect of the present invention, there is provided an LED lamp comprising a plurality of LED modules arranged in a first direction, a tubular enclosure for housing the LED modules that is open at ends spaced from each other in the first direction, and a pair of end caps respectively closing the ends of the tubular enclosure. Each of the end caps is configured to diffuse light from the LED modules while transmitting the light. The end cap includes an emission surface for emitting light in a direction perpendicular to the first direction.

According to a second aspect of the present invention, in the LED lamp provided according to the first aspect of the present invention, the tubular enclosure includes a support member including a mount surface on which the LED modules are mounted. The mount surface is positioned on one side in a second direction perpendicular to the first direction. The tubular enclosure further includes a diffusion cover for diffusing the light from the LED modules while transmitting the light. The diffusion cover covers the one side of the support member in the second direction. The emission surface is provided on the one side in the second direction.

According to a third aspect of the present invention, in the LED lamp provided according to the first or the second aspect of the present invention, each of the end caps is made of a transparent resin added with a light-diffusing material for diffusing light from the LED modules.

According to a fourth aspect of the present invention, in the LED lamp provided according to the second or the third aspect of the present invention, the emission surface is continuous with an outer surface of the diffusion cover.

According to a fifth aspect of the present invention, in the LED lamp provided according to any one of the first through the fourth aspects of the present invention, the LED modules are arranged at regular intervals, and the distance between each of the end caps and one of the LED modules that is closest in the first direction to the end cap is smaller than the interval.

According to a sixth aspect of the present invention, in the LED lamp provided according to the fifth aspect of the present invention, the distance between the outer one of end surfaces of the end cap that are spaced in the first direction and the LED module that is closest in the first direction to the end cap is one half the interval.

According to a seventh aspect of the present invention, in the LED lamp provided according to any one of the first through the third aspects of the present invention, the end cap is provided with a connection plate projecting in the first direction into the tubular enclosure. The connection plate is formed with a screw insertion hole elongated in the first direction. The end cap is attached to the tubular enclosure with a screw inserted into the screw insertion hole such that the emission surface can be accommodated in the tubular enclosure.

According to an eighth aspect of the present invention, in the LED lamp provided according to any one of the first through the sixth aspects of the present invention, the paired end caps include a first end cap having an inclined surface inclined to be away from the emission surface as proceeding outward in the first direction and a second end cap having an inclined surface inclined to come close to the emission surface as proceeding outward in the first direction.

According to a ninth aspect of the present invention, in the LED lamp provided according to any one of the first through the sixth aspects of the present invention, each of the end caps includes a male portion having an inclined surface inclined to come close to the emission surface as proceeding outward in the first direction and a female portion having an inclined surface inclined to be away from the emission surface as proceeding outward in the first direction.

According to a tenth aspect of the present invention, there is provided an LED lighting apparatus comprising at least two LED lamps provided according to any one of the first through the sixth aspects of the present invention which are aligned in the first direction. An end, in the first direction, of one of the end caps of one of two adjacent LED lamps and an end, in the first direction, of one of the end caps of the other one of the two adjacent LED lamps face each other.

According to an eleventh aspect of the present invention, in the LED lighting apparatus provided according to the tenth aspect of the present invention, the end of the end cap of one of two adjacent LED lamps and the end of the end cap of the other one of the two adjacent LED lamps are in contact with each other.

According to a twelfth aspect of the present invention, in the LED lighting apparatus provided according to the eleventh aspect of the present invention, the emission surfaces of the two adjacent LED lamps are continuous with each other.

According to a thirteenth aspect of the present invention, in the LED lighting apparatus provided according to the tenth aspect of the present invention, a plate member is disposed between and in contact with the end caps of the two adjacent LED lamps. The plate member is configured to diffuse light from the LED modules while transmitting the light.

According to a fourteenth aspect of the present invention, in the LED lighting apparatus provided according to the thirteenth aspect of the present invention, the plate member includes a surface continuous with the emission surface of each of the end caps.

According to a fifteenth aspect of the present invention, there is provided an LED lighting apparatus comprising at least two LED lamps provided according to the seventh aspect of the present invention which are aligned in the first direction. An end, in the first direction, of one of the end caps of one of two adjacent LED lamps and an end, in the first direction, of one of the end caps of the other one of the two adjacent LED lamps are in contact with each other.

According to a sixteenth aspect of the present invention, there is provided an LED lighting apparatus comprising at least two LED lamps provided according to the eighth aspect of the present invention which are aligned in the first direction. Each of two adjacent LED lamps includes the first end cap and the second end cap at ends spaced from each other in the first direction. The inclined surface of the first end cap of one of the two adjacent LED lamps and the inclined surface of the second end cap of the other one of the two adjacent LED lamps face each other.

According to a seventeenth aspect of the present invention, there is provided an LED lighting apparatus comprising at least two LED lamps provided according to the ninth aspect of the present invention which are aligned in the first direction. The female portion of one of the end caps of one of two adjacent LED lamps is in engagement with the male portion of one of the end caps of the other one of the two adjacent LED lamps.

According to an eighteenth aspect of the present invention, there is provided a lamp case for housing an LED lamp comprising a plurality of LED modules arranged in a first direction and a tubular enclosure for housing the LED modules. The lamp case comprises a main body including a pair of connecting portions at ends spaced from each other in the first direction, and an end member to be attached to either one of the paired connecting portions. The end member is removably attachable to the connecting portions and includes a wall surface perpendicular to the first direction.

According to a nineteenth aspect of the present invention, in the lamp case provided according to the eighteenth aspect of the present invention, each of the connecting portions is formed with an elongated hole extending in the first direction, and the end member is attached to the connecting portion by inserting a bolt into the elongated hole.

According to a twentieth aspect of the present invention, there is provided an LED lighting apparatus comprising at least two lamp cases provided according to the eighteenth or the nineteenth aspect of the present invention, at least two LED lamps housed in the lamp cases and arranged in the first direction, and an intermediate member to be connected to both of two of the lamp cases that are adjacent to each other in the first direction.

According to a twenty-first aspect of the present invention, there is provided an LED lighting apparatus comprising at least two LED lamps provided according to any one of the first through the sixth aspects of the present invention, at least two lamp cases according to the eighteenth or the nineteenth aspect of the present invention for housing the LED lamps, and an intermediate member to be connected to both of two of the lamp cases that are adjacent to each other in the first direction. An end, in the first direction, of one of the end caps of one of two adjacent LED lamps and an end, in the first direction, of one of the end caps of the other one of the two adjacent LED lamps face each other.

According to a twenty-second aspect of the present invention, in the LED lighting apparatus provided according to the twenty-first aspect of the present invention, the end of the end cap of one of two adjacent LED lamps and the end of the end cap of the other one of the two adjacent LED lamps are in contact with each other.

According to a twenty-third aspect of the present invention, in the LED lighting apparatus provided according to the twenty-second aspect of the present invention, the emission surfaces of the two adjacent LED lamps are continuous with each other.

According to a twenty-fourth aspect of the present invention, in the LED lighting apparatus provided according to the twenty-first aspect of the present invention, a plate member is disposed between and in contact with the end caps of the two adjacent LED lamps. The plate member is configured to diffuse light from the LED modules while transmitting the light.

According to a twenty-fifth aspect of the present invention, in the LED lighting apparatus provided according to the twenty-fourth aspect of the present invention, the plate member includes a surface continuous with the emission surface of each of the end caps.

According to a twenty-sixth aspect of the present invention, there is provided an LED lighting apparatus comprising at least two LED lamps provided according to the seventh aspect of the present invention which are aligned in the first direction, at least two lamp cases provided according to the eighteenth or the nineteenth aspect of the present invention for housing the LED lamps, and an intermediate member to be connected to both of two of the lamp cases that are adjacent to each other in the first direction. An end, in the first direction, of one of the end caps of one of two adjacent LED lamps and an end, in the first direction, of one of the end caps of the other one of the two adjacent LED lamps are in contact with each other.

According to a twenty-seventh aspect of the present invention, there is provided an LED lighting apparatus comprising at least two LED lamps provided according to the eighth aspect of the present invention which are aligned in the first direction, at least two lamp cases provided according to the eighteenth or the nineteenth aspect of the present invention for housing the LED lamps, and an intermediate member to be connected to both of two of the lamp cases that are adjacent to each other in the first direction. Each of two adjacent LED lamps includes the first end cap and the second end cap at ends spaced from each other in the first direction. The inclined surface of the first end cap of one of the two adjacent LED lamps and the inclined surface of the second end cap of the other one of the two adjacent LED lamps face each other.

According to a twenty-eighth aspect of the present invention, there is provided an LED lighting apparatus comprising at least two LED lamps provided according to the ninth aspect of the present invention which are aligned in the first direction, at least two lamp cases provided according to the eighteenth or the nineteenth aspect of the present invention for housing the LED lamps, and an intermediate member to be connected to both of two of the lamp cases that are adjacent to each other in the first direction. The female portion of one of the end caps of one of two adjacent LED lamps is in engagement with the male portion of one of the end caps of the other one of the two adjacent LED lamps.

According to a twenty-ninth aspect of the present invention, there is provided an LED module comprising a substrate in the form of a strip, and a plurality of LED chips disposed on the substrate. The LED chips are arranged in a longitudinal direction of the substrate and form a plurality of rows spaced from each other in a width direction of the substrate. The LED chips in one of two adjacent rows and the LED chips in the other one of the two adjacent rows are deviated from each other in the longitudinal direction of the substrate to form staggered arrangement.

According to a thirtieth aspect of the present invention, in the LED module provided according to the twenty-ninth aspect of the present invention, the plurality of LED chips are incorporated in a plurality of light emitting portions, respectively. Each of the light emitting portions includes a light emission surface that is in the form of an elongated rectangle as viewed in a thickness direction of the substrate. The light emitting portions are arranged such that the longer side of the light emission surface extends in the longitudinal direction of the substrate.

According to a thirty-first aspect of the present invention, in the LED module provided according to the thirtieth aspect of the present invention, in each of the rows, the light emitting portions are arranged at regular intervals smaller than the longer side of the light emission surface.

According to a thirty-second aspect of the present invention, in the LED module provided according to the twenty-ninth aspect of the present invention, the plurality of LED chips are incorporated in a plurality of light emitting portions, respectively. Each of the light emitting portions includes a light emission surface that is in the form of an elongated rectangle as viewed in the thickness direction of the substrate. The light emitting portions are arranged such that the shorter side of the light emission surface extends in the longitudinal direction of the substrate.

According to the thirty-third aspect of the present invention, in the LED module provided according to any one of the twenty-ninth through the thirty-first aspects of the present invention, the number of the rows is two.

According to the thirty-fourth aspect of the present invention, there is provided an LED lighting apparatus comprising an LED module provided according to any one of the twenty-ninth through the thirty-third aspects of the present invention, a support member supporting the substrate and elongated in the longitudinal direction of the substrate, and a diffusion cover connected to the support member and covering the LED chips for diffusing light from the LED chips and emitting the light to outside. The diffusion cover includes a strong diffusion region that includes a portion closest to the LED chips as viewed in the longitudinal direction of the substrate and that diffuses light from the LED chips to a higher degree than the average for an entirety of the diffusion cover.

According to a thirty-fifth aspect of the present invention, in the LED lighting apparatus provided according to the thirty-fourth aspect of the present invention, the diffusion cover is thicker at a portion closer to the LED chips as viewed in the longitudinal direction of the substrate.

According to a thirty-sixth aspect of the present invention, in the LED lighting apparatus provided according to the thirty-fourth aspect of the present invention, the strong diffusion region is made of a material that diffuses light from the LED chip more strongly than a material for other portions of the diffusion cover.

According to a thirty-seventh aspect of the present invention, in the LED lighting apparatus provided according to the thirty-fourth aspect of the present invention, the strong diffusion region comprises a main body of the diffusion cover and a diffusion member laid on the main body to diffuse light from the LED chips.

According to a thirty-eighth aspect of the present invention, in the LED lighting apparatus provided according to any one of the thirty-fourth through the thirty-seventh aspects of the present invention, the LED chips are disposed such that light is emitted from the LED chips mainly in a thickness direction of the substrate. As viewed in the longitudinal direction of the substrate, the outer configuration of the diffusion cover is in the form of an ellipse at the center of which the LED chips are positioned, with minor axis of the ellipse extending in the thickness direction of the substrate.

Other features and advantages of the present invention will become more apparent from detailed description given below with reference to the accompanying drawings.

BRIEF DESCRIPTION OF THE DRAWINGS

FIG. 1 is a perspective view of a first embodiment of LED lamp according to the present invention;

FIG. 2 is an enlarged perspective view of an end cap shown in FIG. 1;

DETAILED DESCRIPTION OF THE PREFERRED EMBODIMENTS

Figure 3:
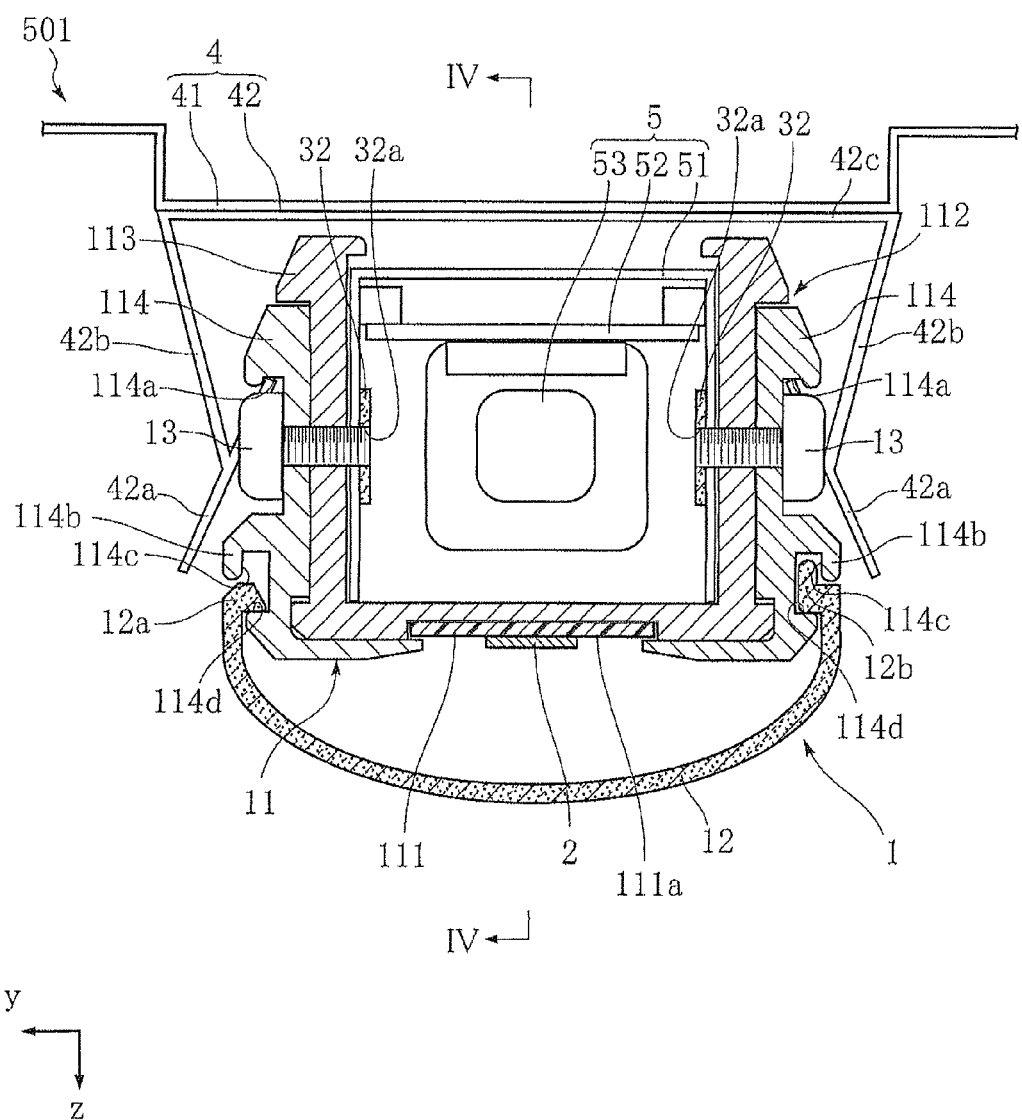
FIG. 3 is a sectional view taken along lines III-III in FIG. 1.

FIGS. 1-4 show an LED lamp according to a first embodiment of the present invention. The LED lamp 501 of this embodiment includes a tubular enclosure 1 elongated in direction x, a plurality of LED modules 2 housed in the tubular enclosure 1, an end cap 3 attached to each end of the tubular enclosure 1, two mounters 4, and a power conversion unit 5. The LED lamp 501 is structured such that the LED modules 2 incorporated in the LED lamp 501 emit light mainly in one of two opposite senses in direction z (downward in FIG. 3, for example). The LED lamp 501 may be attached to e.g. the ceiling of a room to illuminate the floor.

The tubular enclosure 1 includes a support member 11 and a diffusion cover 12. As shown in FIG. 3, the support member 11 is provided for supporting the LED modules 2 and applying electric power to the LED modules 2. The support member 11 includes a substrate 111 and a bracket 112.

The substrate 111, made of e.g. glass-fiber-reinforced epoxy resin, is in the form of a strip having a length in direction x and a width in direction y. The substrate 111 has a constant thickness in direction z and includes a mount surface 111a on one side in direction z (the lower side in FIG. 3, for example). On the mount surface 111a, e.g. 288 LED modules 2 are mounted. The mount surface 111a is formed with a wiring pattern, not shown, for turning on the LED modules 2.

As shown in FIG. 3, the bracket 112 includes a base portion 113 and a pair of outer portions 114. The base portion 113 and the outer portions 114 are made of e.g. aluminum. The base portion 113 is substantially U-shaped in cross section and has an outer bottom surface to which the substrate 111 is attached. Each of the outer portions 114 covers most part of a corresponding side surface of the base portion 113 and one of edges of the substrate 111 which are spaced in direction y. The base portion 113 and the outer portions 114 are fastened together with a plurality of screws 13.

Each of the outer portions 114 is formed with an engagement groove 114a dented in the other sense in direction z (upward in FIG. 3, for example). The engagement groove 114a extends substantially along the entire length of the outer portion 114 in direction x. The outer portion 114 further includes: a bulging portion 114b projecting in direction y from near one end of the outer portion in direction z; an engagement groove 114c formed in the bulging portion 114b and dented in the other sense in direction z; and an engagement surface 114d facing the bottom surface of the engagement groove 114c. The bulging portion 114b, the engagement groove 114c and the engagement surface 114d extend substantially along the entire length of each outer portion 114 in direction x.

As shown in FIG. 1, the diffusion cover 12 is in the form of a strip elongated in direction x and arcuate in cross section. The diffusion cover 12 is made of e.g. a transparent polycarbonate resin added with a light-diffusing material such as mercury chloride. The diffusion cover 12 transmits the light from the LED modules 2 while diffusing the light. As shown in FIG. 3, the diffusion cover 12 includes engagement portions 12a and 12b at the edges that are spaced from each other in direction y. Each of the engagement portions 12a and 12b projects inward in direction y and includes a surface that engages the engagement surface 114d. Part of the engagement portion 12b further projects in the other sense in direction z to be fitted in the engagement groove 114c. The diffusion cover 12 is attached to the support member 11 by pushing the engagement portion 12a into the engagement groove 114c on one side in direction y (the left side in FIG. 3), with the engagement portion 12b fitted in the engagement groove 114c on the other side in direction y.

Each of the LED modules 2 incorporates an LED chip and is electrically connected to the wiring pattern (not shown) formed on the mount surface 11a. The LED modules 2 are designed to emit light mainly in one sense in direction z.

Figure 4:
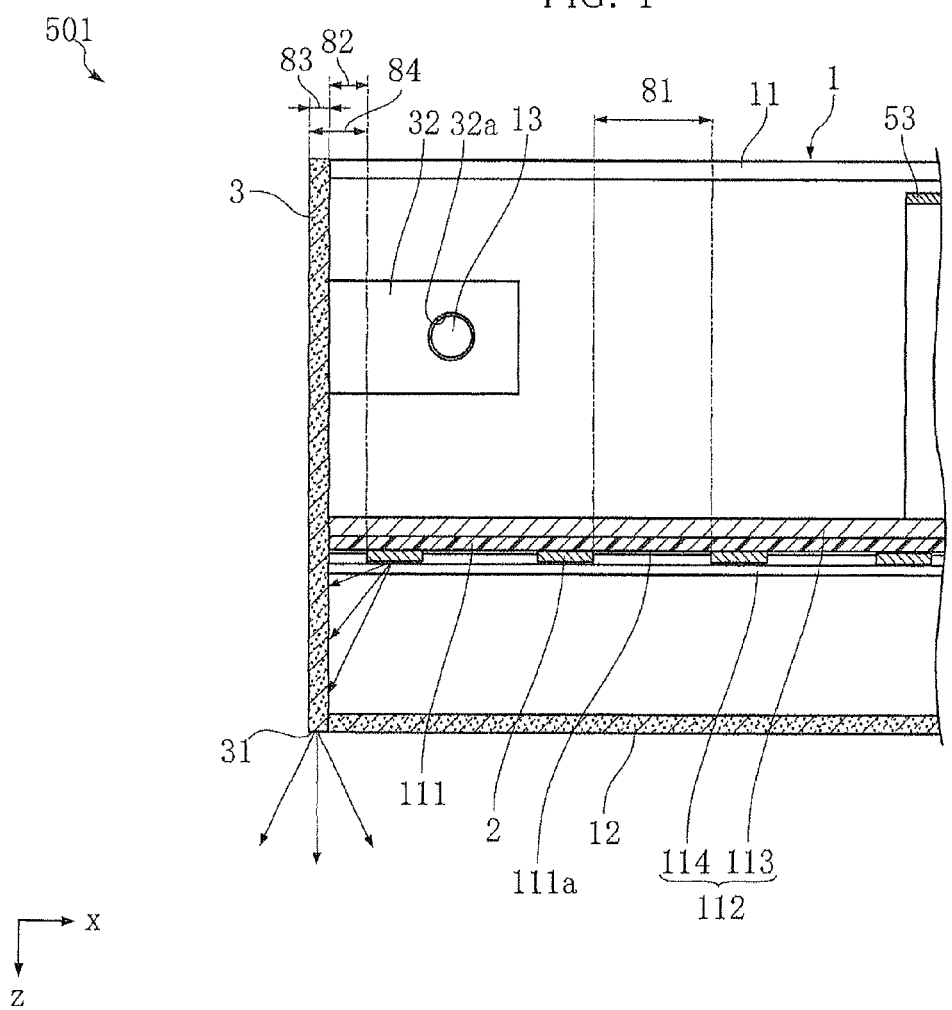
FIG. 4 is a sectional view taken along lines IV-IV in FIG. 3.

The LED modules 2 are mounted on the mount surface 111a at regular intervals in a row extending in direction x. In this embodiment, as shown in FIG. 4, the directly facing ends of two adjacent LED modules 2 are spaced from each other by a distance 81. The LED modules 2 include two outermost (i.e., rightmost and leftmost) modules as viewed in direction x. As shown in the figure, the leftmost LED module 2 has a left end which is spaced from the left end of the support member 11 by a distance 82 that is smaller than the distance 81. Similarly, the right end of the rightmost LED module 2 is spaced from the right end of the support member 11 by the distance 82.

The end caps 3 are provided for preventing dust or the like from entering the tubular enclosure 1. As shown in FIG. 1, each of the end caps 3 is provided to close one of the ends of the tubular enclosure 1 that are spaced in direction x. The end cap 3 has an arcuate outer edge at one side in direction z that conforms to the shape of the diffusion cover 12. In FIG. 2, which is a perspective view showing the end cap 3, the outer edge of the diffusion cover 12 is indicated by double-dashed lines. The end cap 3 is disposed so as not to leave any gaps between itself and the diffusion cover 12. As shown in FIG. 2, the end cap 3 includes an emission surface 31 continuous with the outer surface of the diffusion cover 12, and a pair of connection plates 32 projecting in direction x. The paired connection plates 32 extend parallel with each other while being spaced from each other in direction y and are held in contact with the inner side surfaces of the base portion 113 of the bracket 112. The connection plates 32 are formed with screw insertion holes 32a penetrating in direction y. By inserting screws 13 into the screw insertion holes 32a, the connection plates 2 are fixed to the support member 11. As shown in FIG. 4, the end cap 3 has a constant thickness 83 in direction x. The thickness 83 may be e.g. about 1.5 mm.

Similarly to the diffusion cover 12, the end caps 3 are made of e.g. a transparent polycarbonate resin added with a light-diffusing material such as mercury chloride. The end caps 3 transmit the light from the LED modules 2 while diffusing the light. The concentration of the light-diffusing material in the end caps 3 is substantially equal to that in the diffusion cover 12.

In this embodiment, the left end cap 3 (see FIG. 4), attached to the left end of the tubular enclosure 1, has a right (or inner) face that is held in close contact with the left end of the support member 11. Similarly, the right end cap, attached to the right end of the tubular enclosure 1, has a left (or inner) face that is held in close contact with the right end of the support member 11. The distance 82 is set such that the length 84, which is the sum of the distance 82 and the thickness 83 shown in FIG. 4, is equal to one half of the distance 81 between two adjacent LED modules 2.

Each of the mounters 4 is used for fixing the LED lamp 501 to a ceiling or wall, for example. The mounter 4 includes a base metal fitting 41 and a holder 42. The base metal fitting 41 is formed by e.g. punching and bending a metal plate, and includes a hole 41a for inserting a screw. As shown in FIG. 1, the hole 41a is T-shaped, made up of a portion elongated in direction y and a portion elongated in direction x. Thus, even after the base metal fitting 41 is attached to a ceiling or a wall with a screw, position adjustment is possible within the range corresponding to the size of the hole 41a.

The holder 42 is made by e.g. bending a metal plate. As shown in FIG. 3, the holder 42 includes a pair of engagement pieces 42a, a pair of flexible portions 42b and a connecting portion 42c connecting the flexible portions 42b to each other. The flexible portions 42b support the engagement pieces 42a. When an external force is applied to the flexible portions 42b, the flexible portions 42b elastically deform to move the paired engagement pieces 42a toward or away from each other. The engagement pieces 42a are in engagement with the engagement grooves 114a of the support member 11 and inclined to come closer to each other as proceeding upward in FIG. 3.

The power conversion unit 5 has a function of converting electric power from e.g. commercial AC 100 V to DC 36 V, and is housed in the support member 11. The power conversion unit 5 includes a case 51, a power supply substrate 52 and a plurality of electronic components 53. The case 51 is substantially U-shaped in cross section and made of metal, for example. The power supply substrate 52 is fixed to the case 51. The electronic components 53 are mounted on the power supply substrate 52. Examples of the electronic components 53 include a transformer, a rectifier and a transistor for constant-current control. A connector 54 extends from the power conversion unit 5. The connector 54 is connected to a connector (not shown) provided at the ceiling or wall on which the LED lamp 501 is attached.

In this embodiment, two power conversion units 5 are provided, and each power conversion unit 5 applies electric power to 144 LED modules 2. The 144 LED modules 2 are divided in twelve groups each of which consists of twelve LED modules 2 connected in series to each other. The twelve groups are connected parallel with each other. With this arrangement, DC power of about 3 V and about 20 mA is supplied to each LED chip in each LED module 2.

The advantages of the LED lamp 501 are described below.

In the LED lamp 501, as shown in FIG. 4, the light emitted from the LED module 2 positioned at an end in direction x mainly enters the end cap 3. Since the end cap is made of a resin added with a light-diffusing material as described above, the light entering the end cap 3 is diffused and partially emitted from the emission surface 31 in direction z. Thus, when the LED lamp 501 is attached to a ceiling and viewed from below, it looks as if light is emitted also from the end of the LED lamp 501 in direction x, similarly to other portions of the LED lamp.

Figure 5:
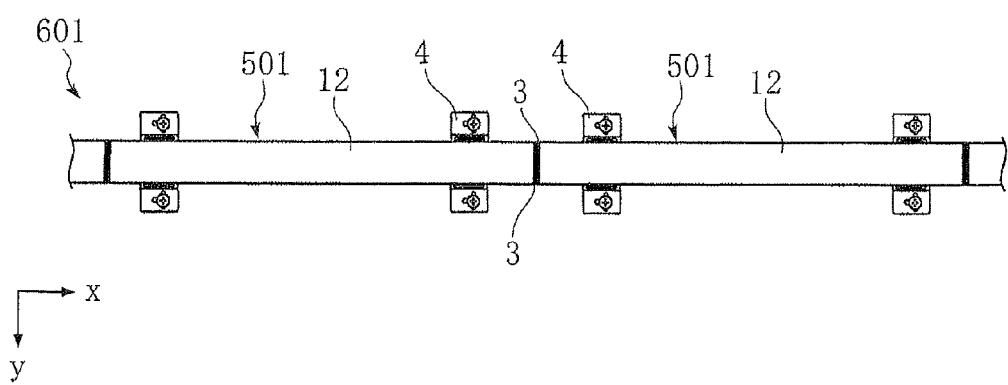
FIG. 5 is a plan view of an LED lighting apparatus obtained by combining the LED lamps shown in FIG. 1.
Figure 6:
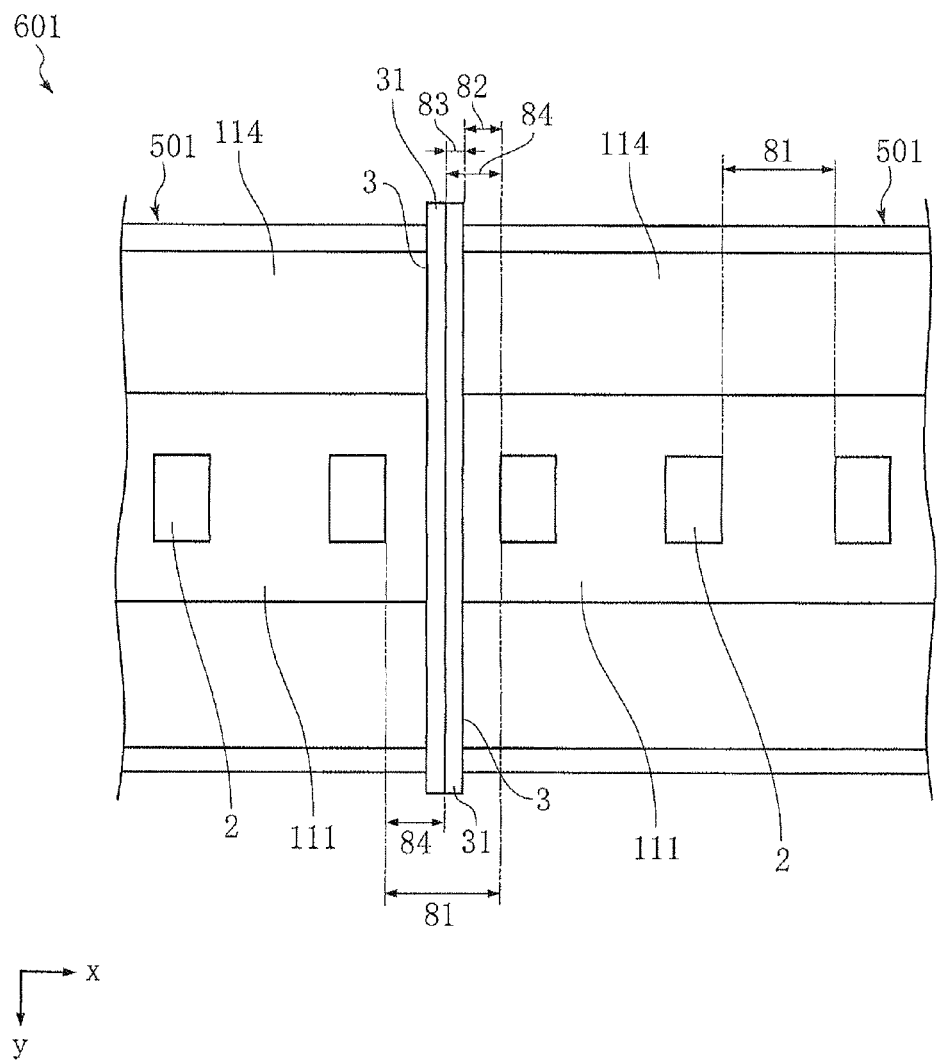
FIG. 6 shows a joint portion in the LED lighting apparatus shown in FIG. 5.

FIG. 5 is a plan view showing part of an LED lighting apparatus 601 obtained by combining a plurality of LED lamps 501 described above. As shown in FIG. 5, in the LED lighting apparatus 601, the LED lamps 501 are attached to a ceiling or a wall as aligned in direction x. FIG. 6 is an enlarged view showing the joint portion of adjacent LED lamps 501. In this figure, the illustration of the diffusion cover 12 is omitted to show the interior of the LED lamps 501.

As shown in FIG. 6, in the LED lighting apparatus 601, the end caps 3 of two adjacent LED lamps 501 are in contact with each other. In this state, the distance between the two LED modules 2 adjacent to each other with the two end caps 3 interposed between them is equal to the distance 81. Since the end caps 3 of two adjacent LED lamps 501 are in contact with each other, light passing through one of the end caps 3 is diffused in the other one of the end caps 3. Thus, in the LED lighting apparatus 601, part of the light emitted in direction x from one LED lamp 501 enters the end cap 3 of the adjacent LED lamp 501 and is emitted in direction z to the outside from the emission surface 31 of this end cap 3. Thus, in the LED lighting apparatus 601, light from the LED modules 2 is utilized efficiently.

As noted before, since the end cap 3 diffuses the light from the LED module 2 while transmitting the light, it looks as if light is emitted also from the emission surface 31. Thus, in the LED lighting apparatus 601, the joint portion of the LED lamps 501 is not dark. Thus, by combining the LED lamps 501 together, the LED lighting apparatus 601 is obtained which is long in direction x and has a good appearance.

In this embodiment, the distance between adjacent LED modules 2 at the joint portion of the LED lamps 501 is equal to the distance 81 between adjacent LED modules 2 at other locations. Thus, the joint portion is not dark as compared with other portions, which also contributes to the good appearance.

FIGS. 7-26 show other embodiments of the present invention. In these figures, the elements that are identical or similar to those of the foregoing embodiments are designated by the same reference signs as those used for the foregoing embodiments.

Figure 7:
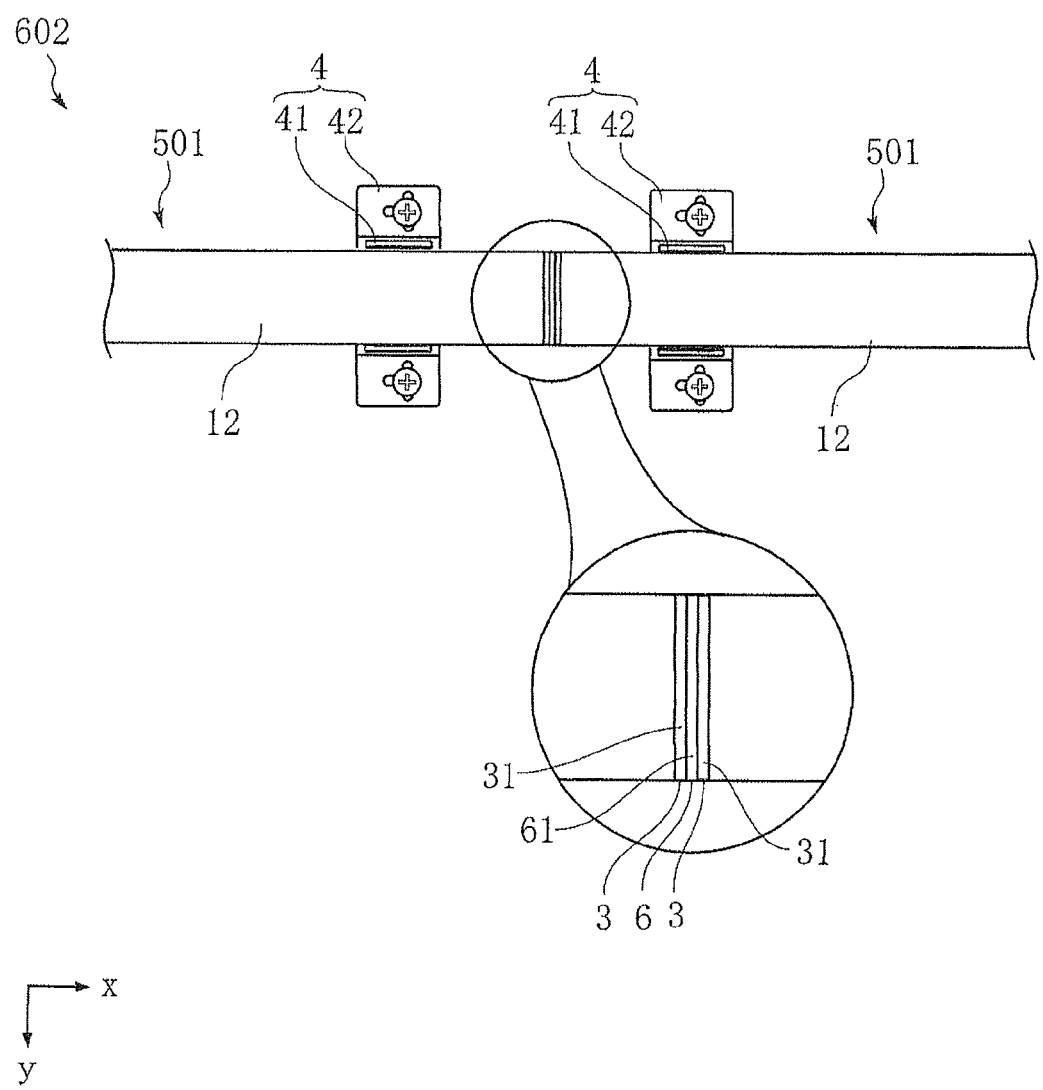
FIG. 7 is a plan view showing another example of the LED lighting apparatus shown in FIG. 5.

FIG. 7 is a plan view showing part of an LED lighting apparatus 602 obtained by combining a plurality of LED lamps 501 described above. The LED lighting apparatus 602 shown in FIG. 7 includes a plate member 6 provided between the end caps 3 of two adjacent LED lamps 501. The structure of other parts of the LED lighting apparatus 602 is the same as that of the LED lighting apparatus 601 shown in FIGS. 5 and 6.

As shown in FIG. 7, the plate member 6 is sandwiched between the right end surface of the end cap 3 on the left side in direction x in the figure and the left end surface of the end cap 3 on the right side in the figure. The shape of the plate member 6 as viewed in direction x corresponds to that of the end caps 3. The plate member 6 includes an emission surface 61 continuous with the emission surfaces of the right and left end caps 3 in FIG. 7. The plate member 6 is made of e.g. a transparent polycarbonate resin added with a light-diffusing material such as mercury chloride. The concentration of the light-diffusing material in the plate member 6 is substantially equal to that in the diffusion cover 12. The plate member 6 transmits part of the light emitted from the LED modules 2 and passing through the end cap 3, while diffusing the light. Part of the light diffused within the plate member 6 is emitted in direction z from the emission surface 61 to the outside.

In the LED lighting apparatus 602 again, it looks as if light is emitted also from the plate member 6, similarly to the end caps 3. Thus, the joint portion of the LED lamps 501 is not dark. Thus, the LED lighting apparatus 602 has a good appearance.

To realize the structure shown in FIG. 7 in a desirable way, a plurality of plate members 6 that are different in thickness in direction x may be prepared in advance so that one of the plate members that has a thickness corresponding to the gap, if defined between the right and left end caps 2 shown in FIG. 7, can be selected and fitted into the gap.

Also in the above-described LED lighting apparatus 601, a gap may be defined between the ends of two adjacent LED lamps 501 when a large number of LED lamps 501 are aligned. In such a case, the plate member 6 of the LED lighting apparatus 602 can be employed to prevent the joint portion of the LED lamps 501 from looking dark.

In the foregoing embodiments, each end cap 3 is disposed outside the diffusion cover 12 such that the emission surface 31 is continuous with the outer surface of the diffusion cover 12. However, the end cap 3 may be arranged inside the diffusion cover 12 such that the emission surface 13 comes into contact with the inner surface of the diffusion cover 12. In this case, the length of the diffusion cover 12 in direction x is larger than that of the support member 11 by twice the thickness of the end cap 3 in direction x.

Figure 8:
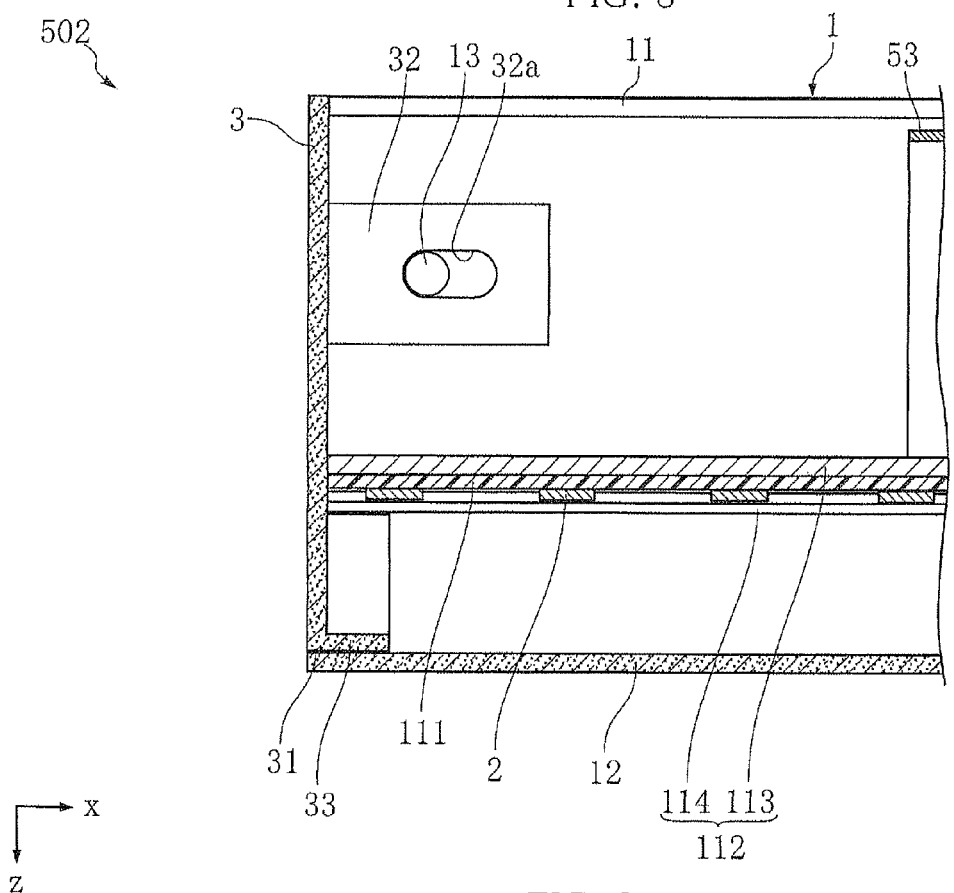
FIG. 8 is a sectional view showing a second embodiment of LED lamp according to the present invention.
Figure 9:
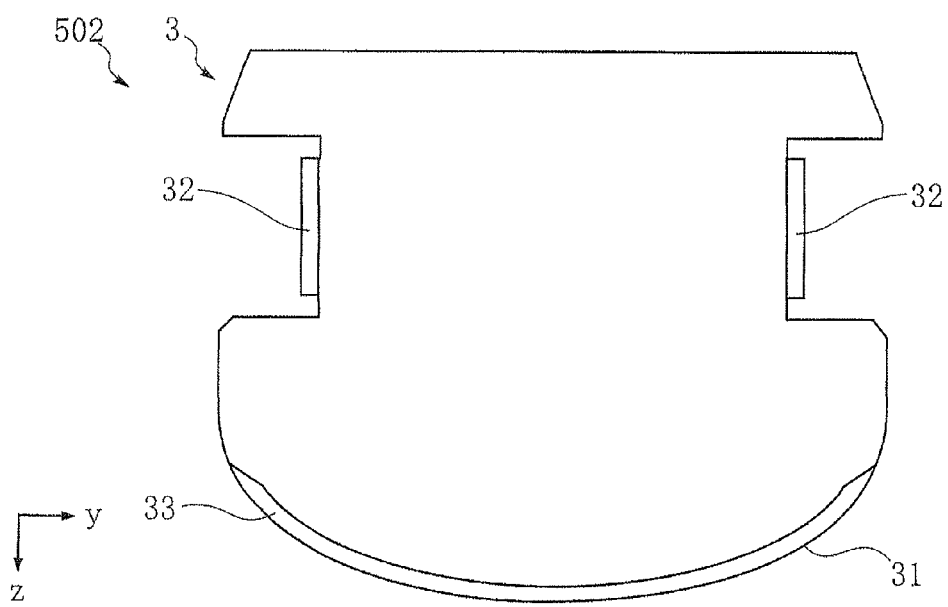
FIG. 9 is a plan view of an end cap shown in FIG. 8.
Figure 10:
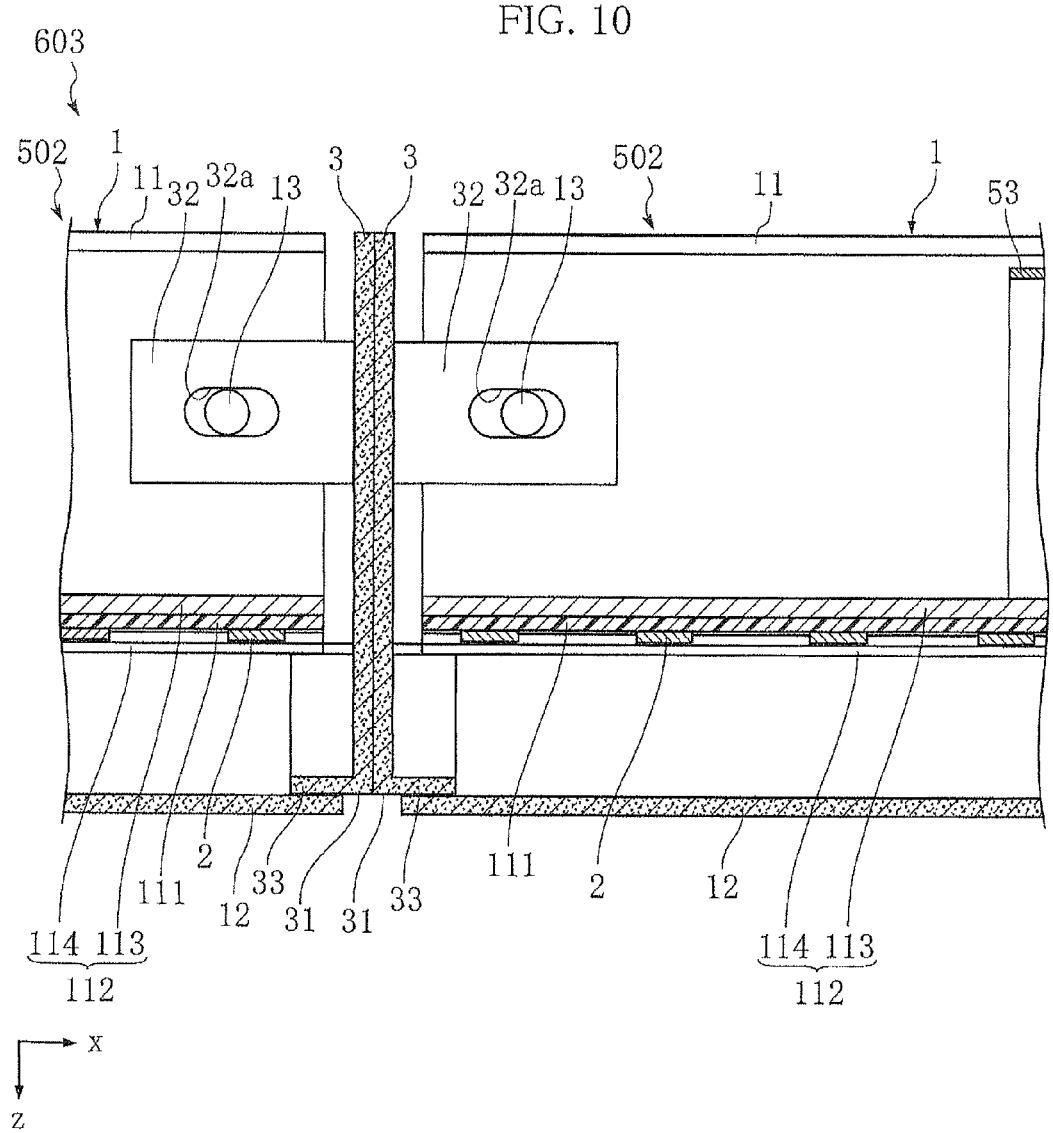
FIG. 10 is a sectional view of an LED lighting apparatus obtained by combining the LED lamps shown in FIG. 8.

FIG. 8 shows an end of the LED lamp according to a second embodiment of the present invention. The LED lamp 502 shown in FIG. 8 is different from the LED lamp 501 in shape of the end caps 3 and length of the diffusion cover 12 in direction x. The structure of other parts is the same as that of the LED lamp 501. FIG. 9 shows the end cap 3 of the LED lamp 502 as viewed from inside the LED lamp 502. FIG. 10 shows the joint portion of an LED lighting apparatus 603 obtained by combining a plurality of LED lamps 502. In the LED lighting apparatus 603, the LED lamps 502 are attached to a ceiling or a wall as aligned in direction x. In FIG. 10, the gap between the LED lamps 502 is intentionally made large for convenience of explanation.

The length in direction x of the diffusion cover 12 of this embodiment is larger than that of the support member 11. In this embodiment, the end caps 3 are arranged inside the diffusion cover 12. Each of the end caps 3 of this embodiment includes an eaves portion 33 at the lower end in FIG. 9. As shown in FIG. 8, the eaves portion 33 extends from the edge of the end cap 3 into the tubular enclosure 1 in direction x. The outer surface of the eaves portion 33 is integral with the emission surface 31. In this embodiment, the emission surface 31 of the end cap 3 is in contact with the inner surface of the diffusion cover 12.

In this embodiment, the screw insertion hole 32a formed in each of the connection plates 32 is elongated in direction x. Thus, the end cap 3 can move the distance corresponding to the length of the screw insertion hole 32a in direction x. When the end cap 3 is pulled out of the tubular enclosure 1 in direction x, the outer surface of the eaves portion 33 is exposed to the outside of the diffusion cover 12.

In the LED lighting apparatus 603 obtained by combining the LED lamps 502 having this structure, a gap between adjacent LED lamps 502, if it exists, can be closed by the eaves portion 33 by pulling out the end cap 3 from the tubular enclosure 1. Since the eaves portion 33 is part of the end cap 3, the eaves portion 33 transmits the light from the LED modules 2 while diffusing the light. Thus, when the LED lighting apparatus 603 is viewed from a lower portion in direction z, it looks as if light is emitted also from the eaves portion 33. Thus, the LED lighting apparatus 603 does not include dark portions along direction x.

Figure 11:
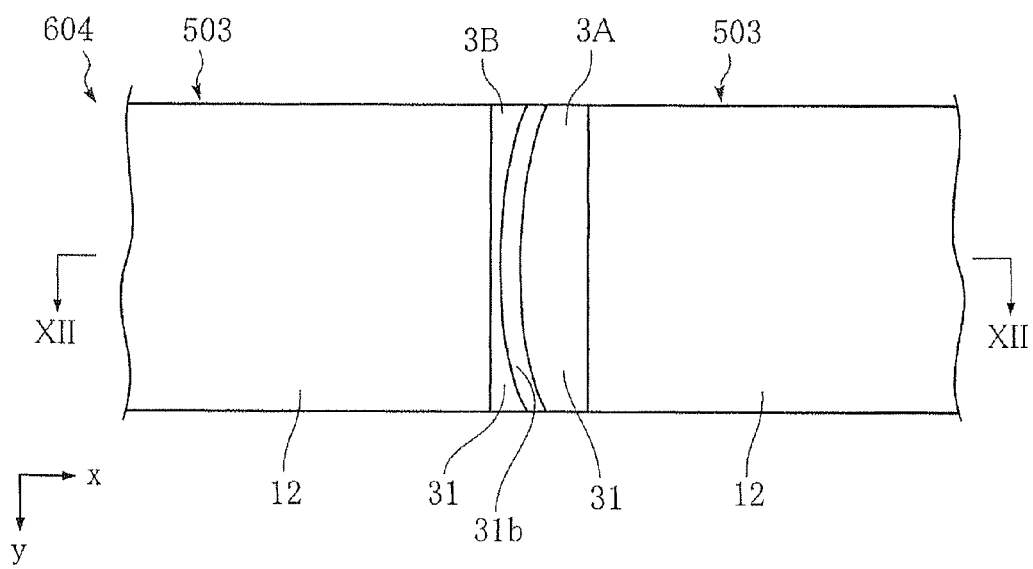
FIG. 11 is a plan view showing a joint portion in an LED lighting apparatus obtained by combining LED lamps of a third embodiment.
Figure 12:
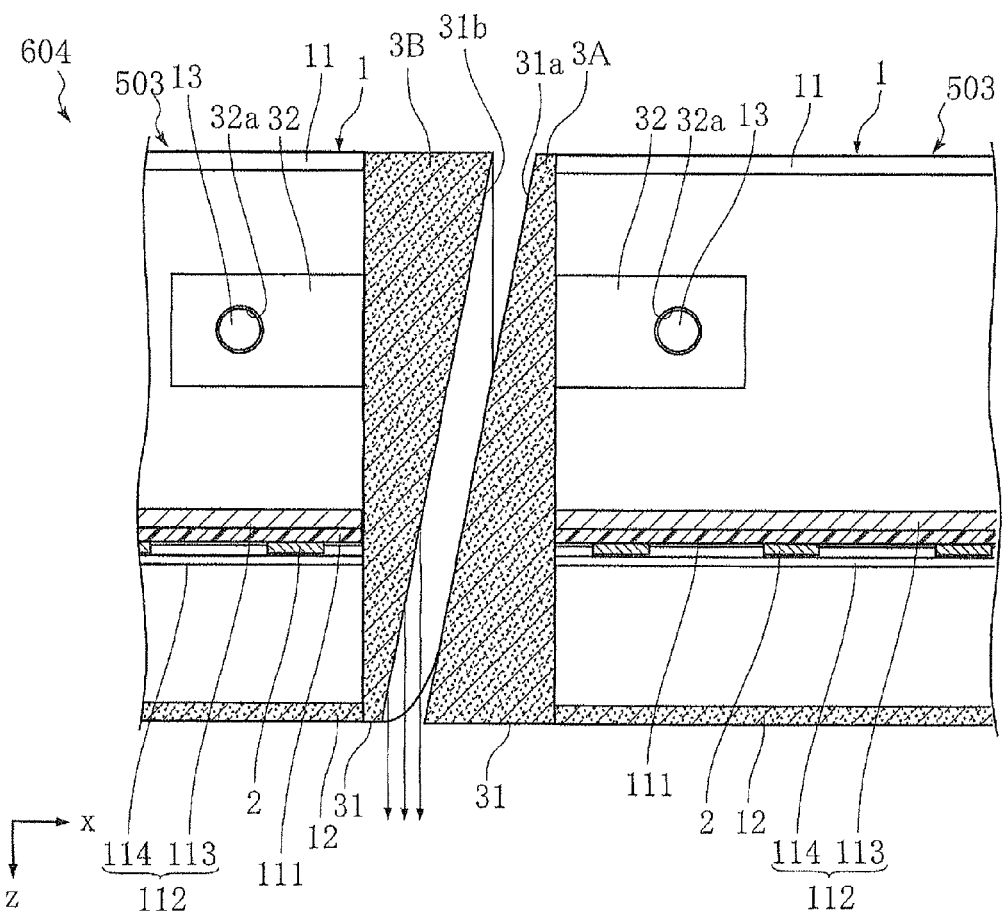
FIG. 12 is a sectional view taken along lines XII-XII in FIG. 11.

FIGS. 11 and 12 show a joint portion of an LED lighting apparatus obtained by combining LED lamps according to a third embodiment of the present invention. As shown in FIGS. 11 and 12, each of the LED lamps 503 of this embodiment includes an end cap 3A at one of the ends spaced in direction x and an end cap 3B at the other one of the ends. The structure of other parts is the same as that of the LED lamp 501.

The thickness of the end cap 3A in direction x increases as proceeding downward in direction z in FIG. 12. Thus, the end cap 3A has an inclined surface 31a which is so inclined as to come closer to the emission surface 31 in direction z as proceeding outward of the right enclosure 1 in direction x (to the left in the figure). The thickness of the end cap 3B in direction x reduces as proceeding downward in direction z in FIG. 12. Thus, the end cap 3B has an inclined surface 31b which is so inclined as to be more apart from the emission surface 31 in direction z as proceeding outward of the left enclosure in direction x (to the right in the figure).

In the LED lighting apparatus 604 obtained by combining the LED lamps 503 having the above-described structure, the end cap 3A and the end cap 3B face each other at the joint portion, as shown in FIGS. 11 and 12. It is preferable to arrange the LED lamps 503 such that the inclined surface 31a and the inclined surface 31b come into contact with each other without any gaps. However, when a large number of LED lamps 503 are used, it is difficult to align such a large number of LED lamps 503 perfectly without any gaps. In this embodiment, even when a gap is defined between the end cap 3A and the end cap 3B, the inclined surface 31b looks bright when the LED lighting apparatus 604 is viewed from a lower portion in direction z in FIG. 12. Thus, the LED lighting apparatus 604 does not include dark portions along direction x.

Figure 13:
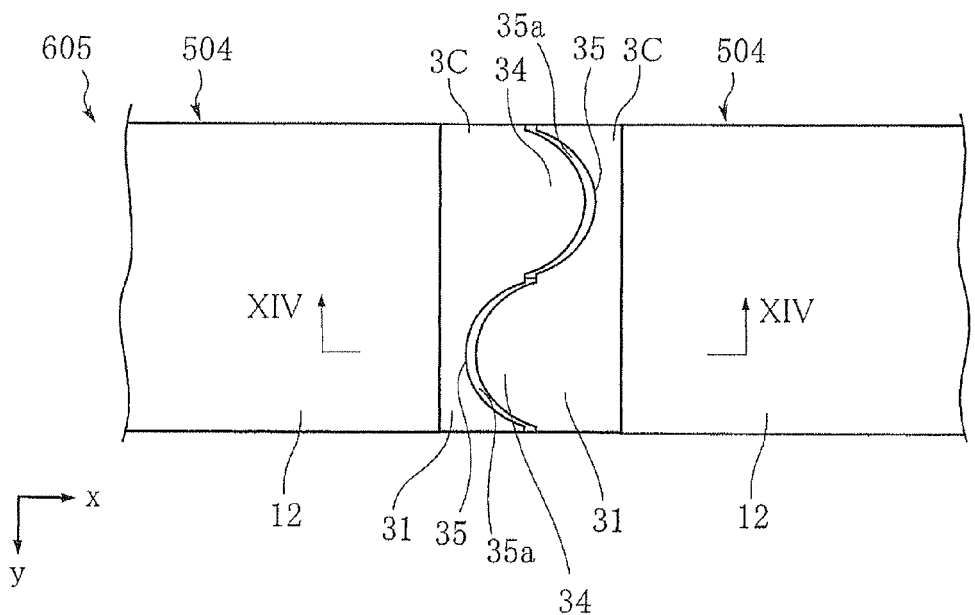
FIG. 13 is a plan view showing a joint portion in an LED lighting apparatus obtained by combining LED lamps of a fourth embodiment.
Figure 14:
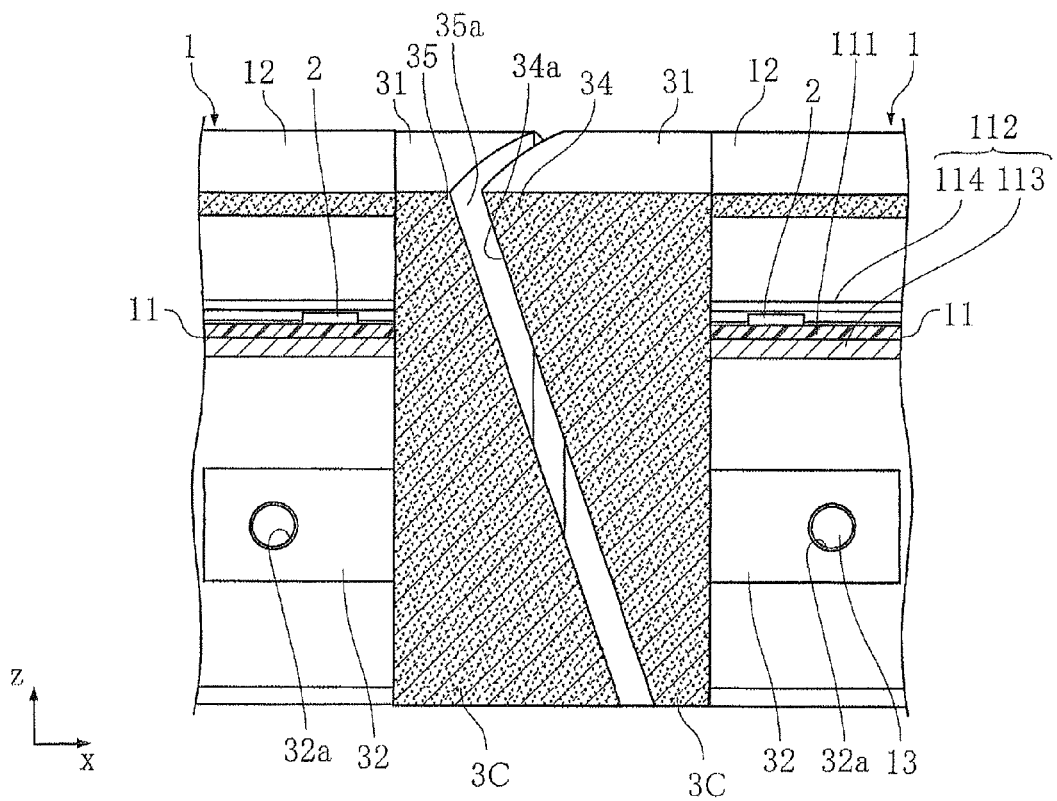
FIG. 14 is a sectional view taken along lines XIV-XIV in FIG. 13.

FIGS. 13 and 14 show a joint portion of an LED lighting apparatus obtained by combining LED lamps according to a fourth embodiment of the present invention. As shown in FIGS. 13 and 14, each of the LED lamps 504 of this embodiment includes end caps 3C instead of the end cap 3. The structure of other parts is the same as that of the LED lamp 501.

Each of the end caps 3C includes a male portion 34 formed on one side in direction y and a female portion 35 formed on the other side in direction y. The male portion 34 includes an inclined surface 34a inclined to come close to the emission surface 31 in direction z as proceeding outward in direction x. Further, the male portion 34 bulges outward in direction x as proceeding toward the emission surface 31 in direction z. Further, the male portion bulges outward in direction x as proceeding toward the center in direction y. The female portion 35 includes an inclined surface 35a inclined to be away from the emission surface 31 in direction z as proceeding outward in direction x. To fit to the male portion 34, the female portion 35 retreats inward in direction x as proceeding toward the emission surface 31 in direction z. Further, the female portion 35 retreats inward in direction x as proceeding toward the center in direction y.

As shown in FIGS. 13 and 14, in the LED lighting apparatus 605 obtained by aligning the LED lamps 504 in direction x, the male portion 34 and the female portion 35 of the end caps 3C attached to the ends of two LED lamps 504 engage each other. It is preferable to arrange the LED lamps 504 such that the two end caps 3C come into contact with each other. However, when a large number of LED lamps 504 are used, a gap may be defined between the end caps 3C. In this embodiment, even in such a case, the inclined surface 35a is seen through the gap between the end caps 3C, and the inclined surface 35a looks bright similarly to the emission surface 31. The end cap 3C of this embodiment can be attached to either end of the tubular enclosure 1, which is economical.

Figure 15:
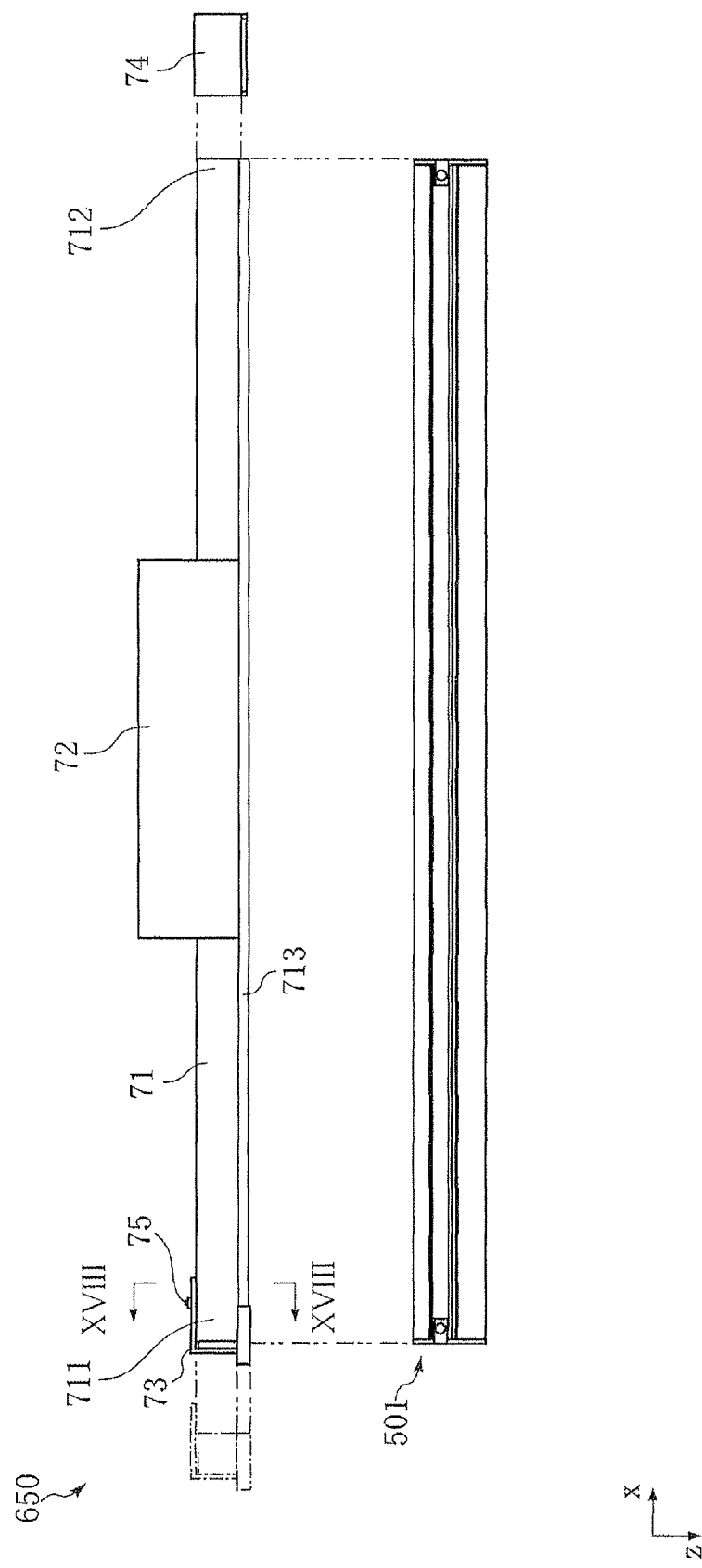
FIG. 15 is a side view showing an example of lamp case according to the present invention.
Figure 16:
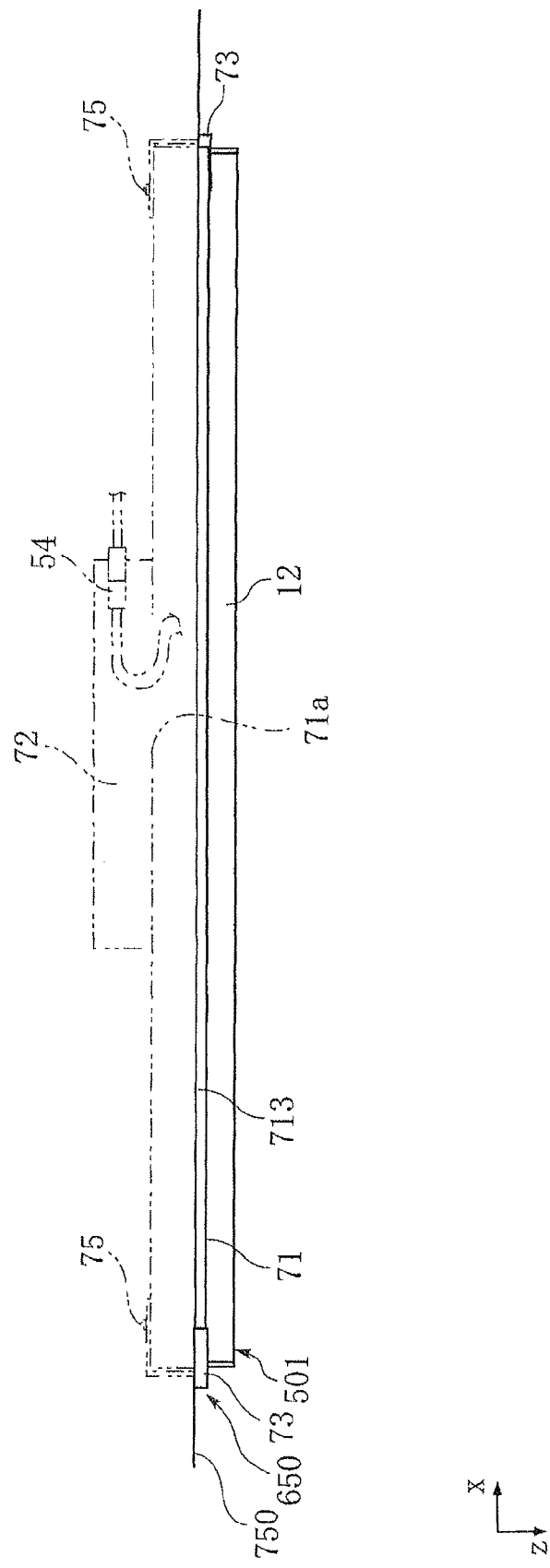
FIG. 16 shows the lamp case of FIG. 15, holding an LED lamp and attached to a ceiling.
Figure 17:
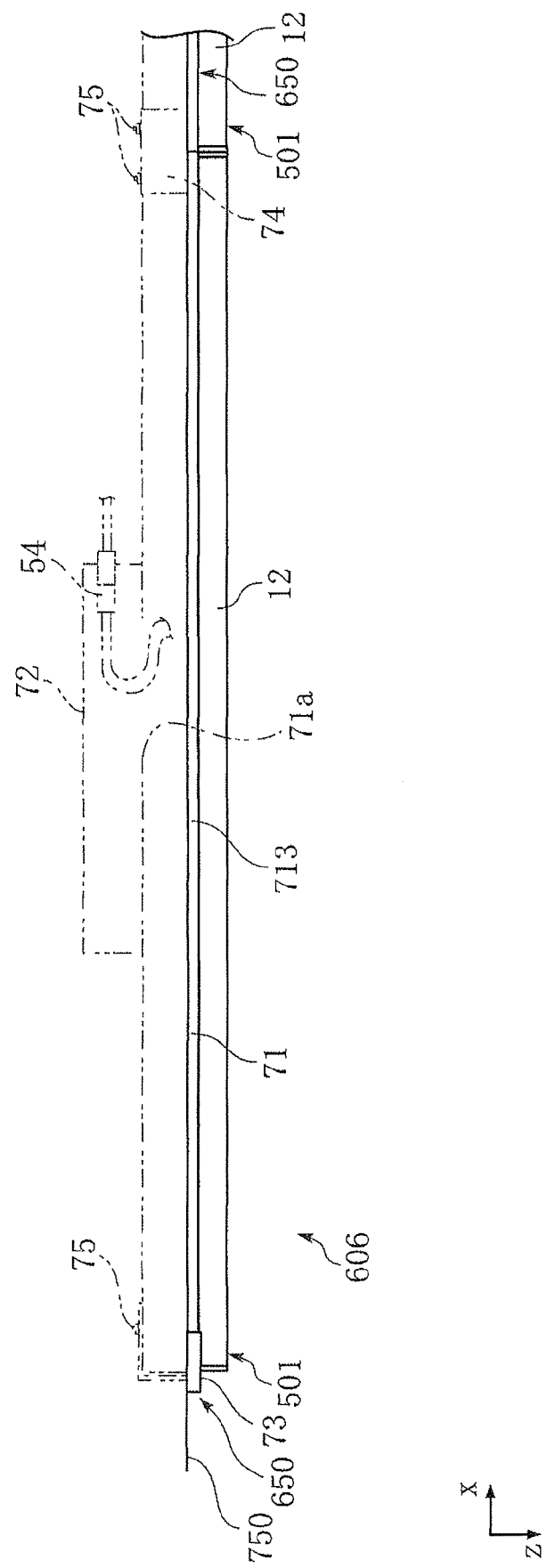
FIG. 17 shows the state in which a plurality of lamp cases shown in FIG. 15, each holding an LED lamp, are attached to a ceiling.

FIGS. 15-26 show an example of lamp case according to the present invention. The lamp case 650 shown in FIG. 15 can be used, instead of the mounters 4 of the foregoing embodiment, for attaching the LED lamp 501-504 to a ceiling. In FIG. 15, the LED lamp 501 is exemplarily shown for explanation. FIG. 16 shows the state in which the lamp case 650 holding the LED lamp 501 is attached to the ceiling 750. FIG. 17 shows an LED lighting apparatus 606 made up of a plurality of lamp cases 650, each holding an LED lamp 501, aligned in direction x. The structure of the LED lighting apparatus 606 corresponds to the structure obtained by replacing the mounters 4 of the LED lighting apparatus 601 with the lamp cases 650.

As shown in FIG. 15, the lamp case 650 includes a main body 71, a connector accommodating portion 72, an end member 73 and an intermediate member 74. As shown in FIG. 17, the end member 73 and the intermediate member 74 are to be attached to the main body 71 with bolts 75. The bolts 75 may be male screws. The end member 73 and the intermediate member 74 are painted with the same color as the main body 71.

Figure 18:
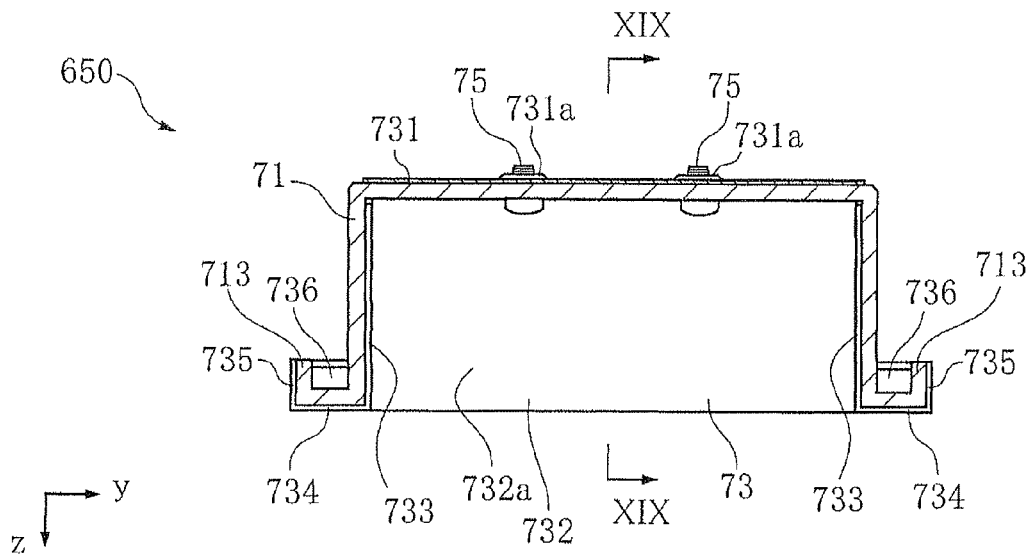
FIG. 18 is a sectional view taken along lines XVIII-XVIII in FIG. 15.
Figure 23:
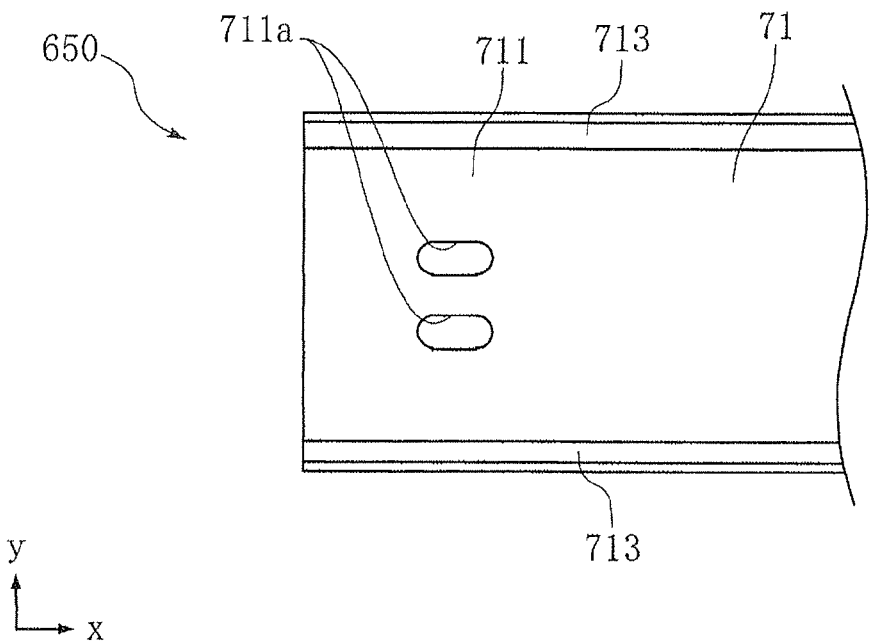
FIG. 23 shows one end of a main body shown in FIG. 15 as enlarged.
Figure 24:
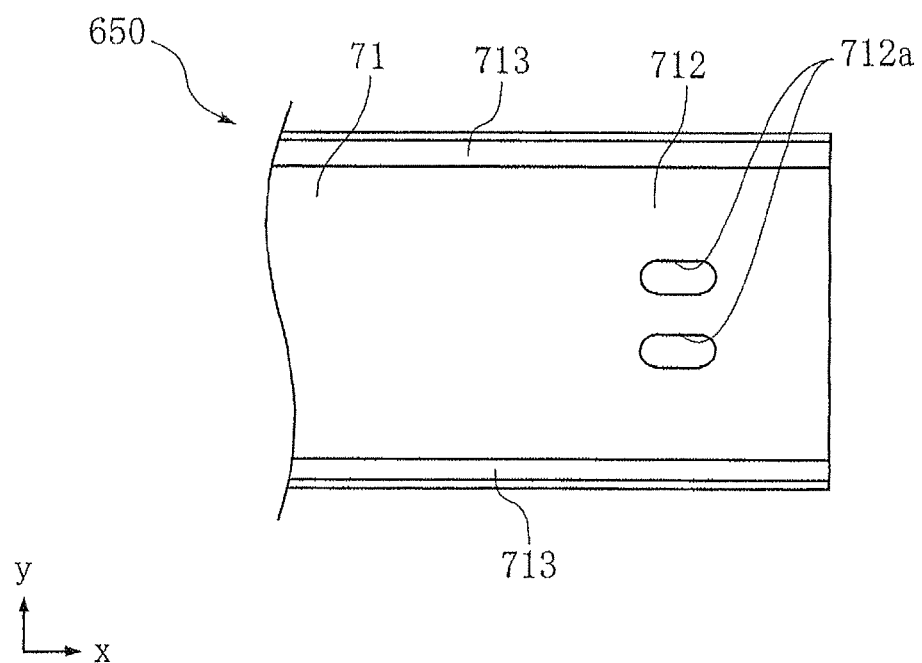
FIG. 24 shows the other end of a main body shown in FIG. 15 as enlarged.

The main body 71 has a substantially U-shaped cross section that opens toward one side in direction z. The main body 71 is elongated in direction x and includes a connecting portion 711 at one of the ends spaced in direction x and a connecting portion 712 at the other end. As shown in FIG. 23, the connecting portion 711 is formed with a pair of elongated holes 711a extending in direction x. As shown in FIG. 24, the connecting portion 712 is formed with a pair of elongated holes 712a extending in direction x. The elongated holes 711a and 712a have the same configuration and allow the bolts 75 to pass through them. The main body 71 further includes a pair of projecting portions 713 projecting in direction y from the edges of the main body 71 spaced in direction y. Each of the projecting portions 713 is formed with a groove extending in direction x. As shown in FIGS. 16 and 18, when the lamp case 650 is attached to the ceiling 750, the projecting portions 713 are not positioned inside the ceiling 750 but exposed. The main body 71 is fixed horizontally with respect to the ceiling 750 owing to the contact between the projecting portions 713 and the ceiling 750. Thus, the lamp case 650 is attached to the ceiling 750 without inclination with respect to the ceiling 750 and properly holds the LED lamp 501.

Figure 19:
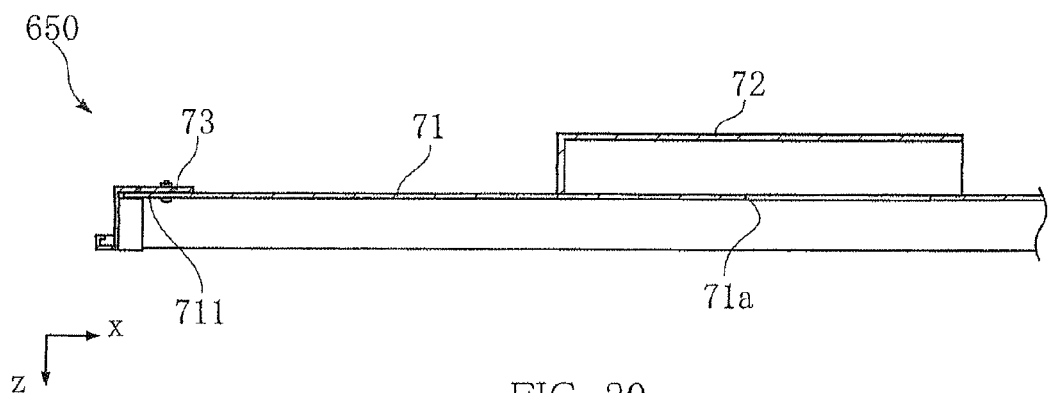
FIG. 19 is a sectional view taken along lines XIX-XIX in FIG. 18.

As shown in FIG. 19, an opening 71a is provided between the main body 71 and the connector accommodating portion 72. The opening 71a is used for passing a cable connecting a connector and a power conversion unit 5. The connector 54 is accommodated in the connector accommodating portion 72. The connector 54 is connected to a power supply unit provided in the ceiling 750.

Figure 20:
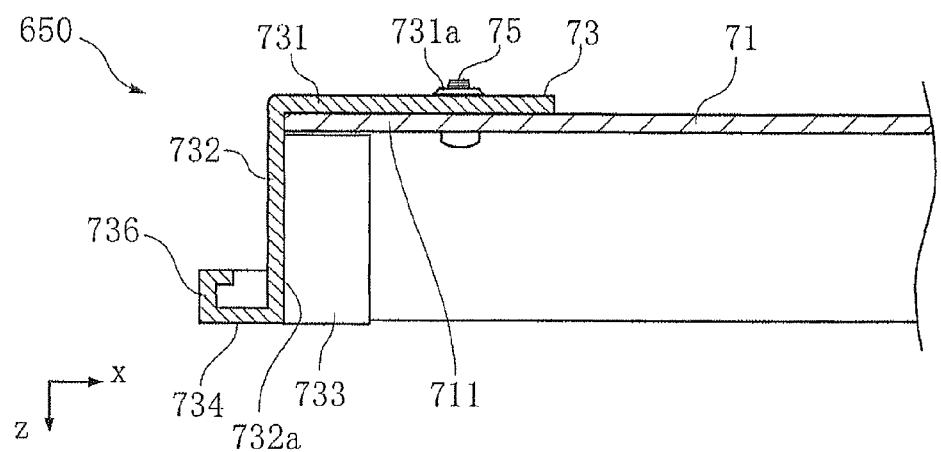
FIG. 20 shows a principal portion of FIG. 19 as enlarged.
Figure 21:
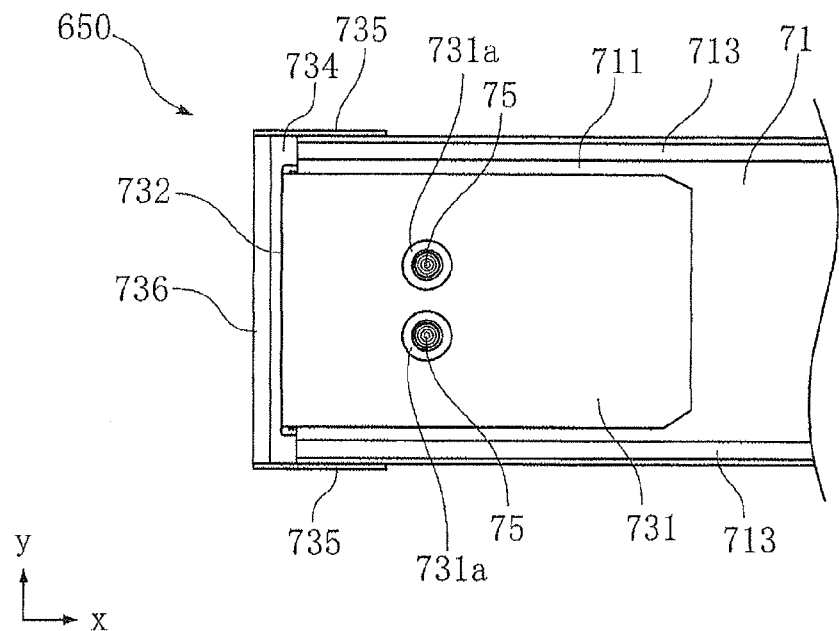
FIG. 21 is a plan view showing part of the lamp case of FIG. 15 as enlarged.

The end member 73 is formed by bending a metal plate and is removably attachable to the connecting portion 711, 712. As shown in FIGS. 18 and 20, the end member 73 includes plate portions 731 and 732 extending perpendicular to each other, a pair of inner walls 733, an outer plate portion 734, and standing walls 735, 736.

The plate portion 731 is rectangular as viewed in direction z. The plate portion 731 is a portion to be fastened to the connecting portion 711, 712 of the main body 71 with bolts 75. The plate portion 731 includes a pair of raised portions 731a which are thicker in direction z than other portions. The paired raised portions 731a are formed with a pair of screw insertion holes for receiving the bolts 75. Each screw insertion holes is formed with a female thread for engagement with the male thread formed on the bolt 75.

The plate portion 732 extends from one of the ends of the plate portion 731 that are spaced in direction x and is rectangular as viewed in direction x. As shown in FIG. 20, the plate portion 732 is a portion for closing one of the ends of the main body 71 that are spaced in direction x and includes a wall surface 732a perpendicular to direction x. The paired inner walls 733 project in direction x from the two edges of the plate portion 732 that are spaced in direction y. The length of the inner walls 733 indirection x is longer than that of the elongated holes 711a and 712a.

Figure 22:
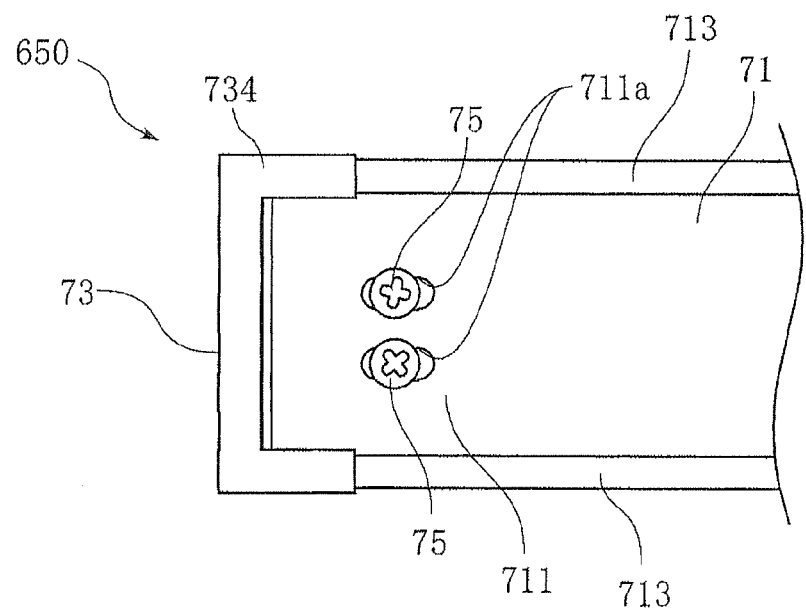
FIG. 22 is a bottom view showing part of the lamp case of FIG. 15 as enlarged.

The outer plate portion 734 extends from the lower edges, in FIG. 20, of the plate portion 732 and paired inner walls 733. As shown in FIG. 22, as viewed in direction z, the outer plate portion 734 looks like a frame provided by extending the projecting portions 713. The standing walls 735 stand on the edges of the outer plate portion 734 that are spaced in direction y and extend along the edges of the projecting portions 713 that are spaced in direction y. As shown in FIG. 18, the position of the upper end of the standing walls 735 in direction z corresponds to that of the projecting portions 713. The standing wall 736 stands on one of the edges of the outer plate portion 734 that are spaced in direction x and faces the plate portion 732. The standing wall 736 is connected to the standing walls 735 at the ends that are spaced in direction y. The standing walls 735 and 736 provide an appearance as if the projecting portions 713 are extended.

Figure 25:
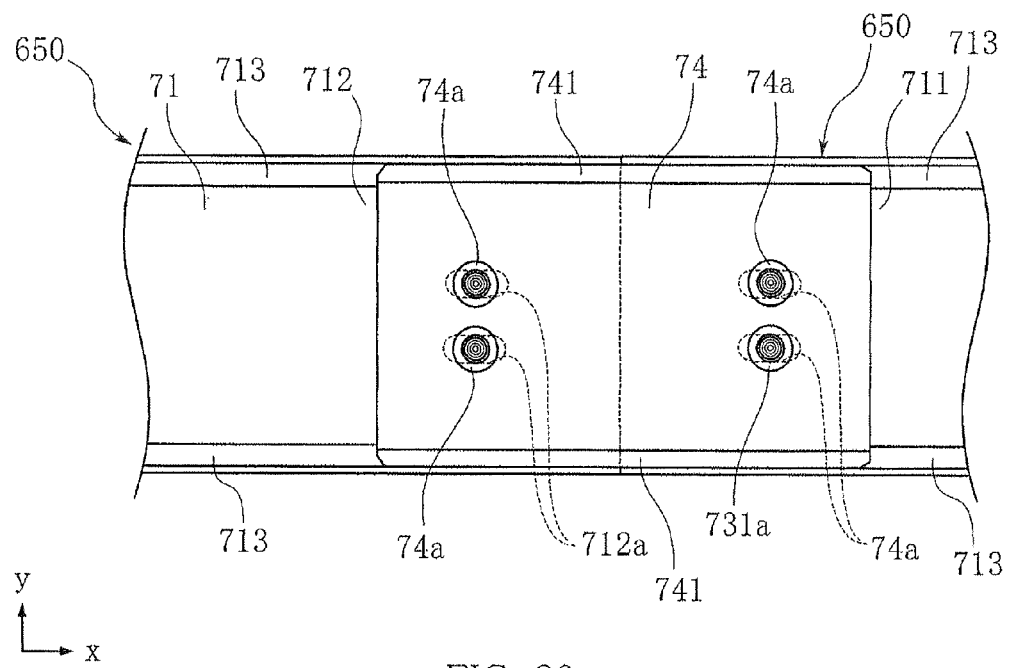
FIG. 25 shows a joint portion of the lamp cases shown in FIG. 17.

The intermediate member 74 is formed by bending a metal plate and is removably attachable to the connecting portion 711, 712. The intermediate portion 74 is substantially U-shaped in cross section to overlap the outer surface of the main body 71. As shown in FIG. 25, the intermediate member 74 is used for connecting a plurality of lamp cases 650 to each other. The intermediate member 74 includes edge portions 741 for fitting into the grooves formed in the projecting portions 713.

The intermediate portion 74 includes two pairs of raised portion 74a which are thicker in direction z than other portions. The raised portions 74a are formed with screw insertion holes for receiving bolts 75. Each screw insertion holes is formed with a female thread for engagement with the male thread formed on the bolt 75. As shown in FIG. 25, the raised portions 74a are provided at locations that overlap the elongated holes 711a and 712a in a state in which the connecting portions 711 and 712 are connected to each other.

The advantages of the lamp case 650 are described below also with reference to FIG. 26.

In the case where a plurality of lamp cases 650 are attached to the ceiling 750 as aligned in direction x, when ends of two adjacent lamp cases 650 are held in contact with each other, a gap may be defined between ends of other two adjacent lamp cases 650. FIG. 26 shows the joint portion of two lamp cases 650 seen from below, in a state in which a gap is defined between the main bodies 71 of the lamp cases 650. It is to be noted that the illustration of the LED lamp 501 is omitted in FIG. 26.

Figure 26:
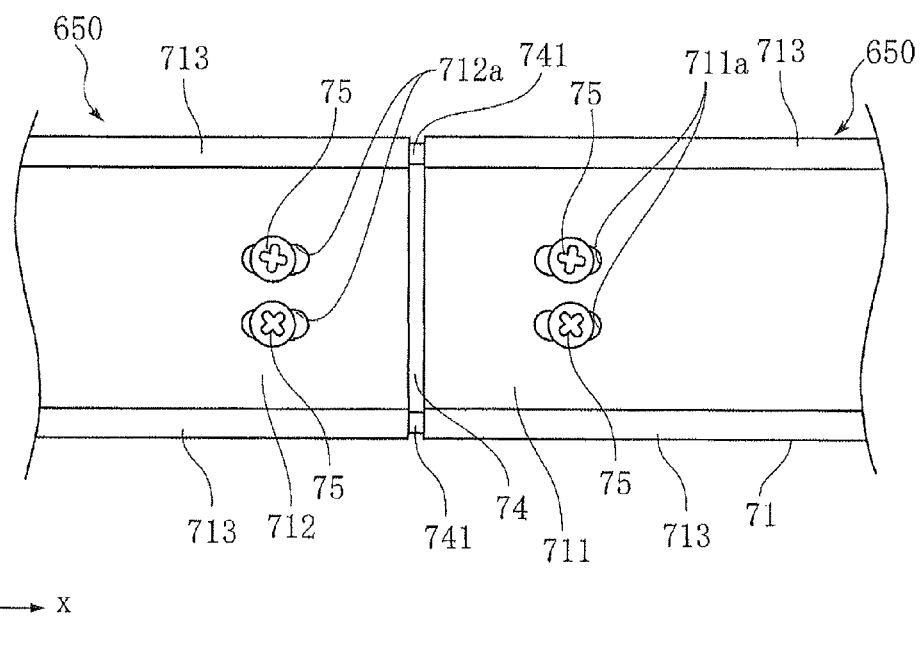
FIG. 26 is a view for explaining the advantages of the lamp case according to the present invention.

In this embodiment, as shown in FIG. 26, even when a gap exists between the connecting portions 711 and 712 of adjacent two main bodies 71, the intermediate member 74 can be attached to the connecting portions 711 and 712 by changing the position of the bolts 75 within the elongated holes 711a, 712a. As shown in FIG. 26, not the ceiling but the intermediate member 74 is seen through the gap between the main bodies 71, which provides a good appearance.

Further, the position of the end member 73 can also be changed in direction x by changing the position of the bolts 75 within the elongated holes 712a, 712a. Thus, when the adjustment at the intermediate member 74 is not enough to cope with the situation, moving the end member 73 at the ends of the lamp case 640 spaced in direction x can cope with the situation.

Figure 27:
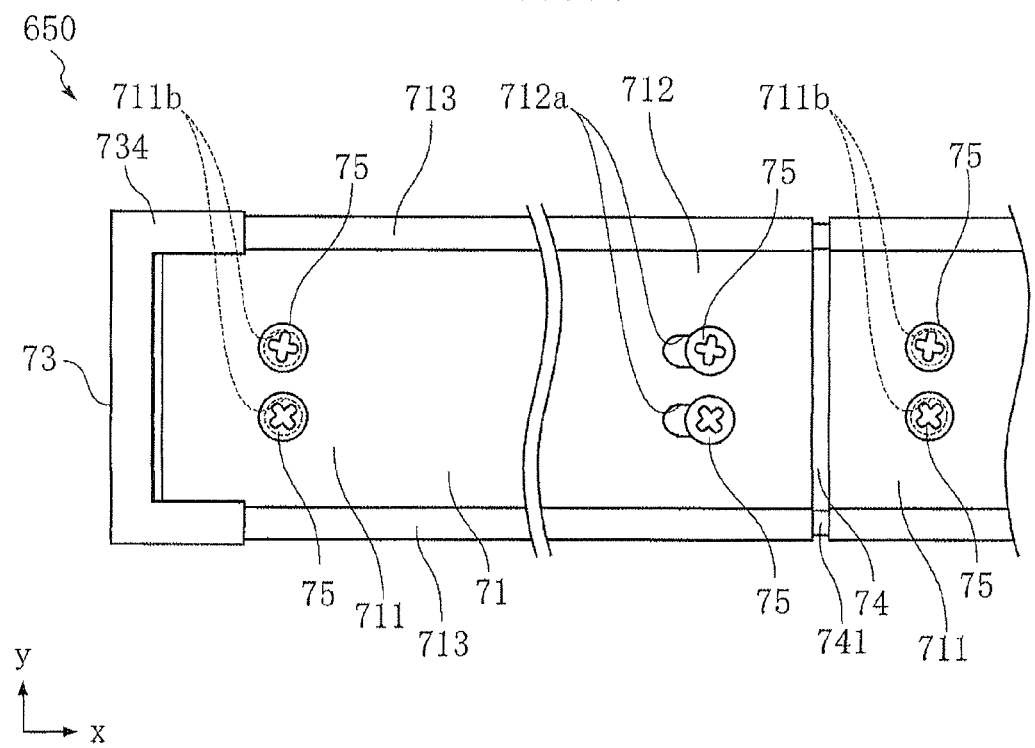
FIG. 27 shows a first variation of the lamp case.

FIG. 27 shows a first variation of the lamp case 650. In this variation, circular screw insertion holes 711b are provided instead of the elongated holes 711a. The structure of other parts is the same as that of the lamp case 650 shown in FIGS. 15-26. Similarly to FIG. 26, FIG. 27 shows the state in which the lamp cases 650 of this variation are aligned. As shown in FIG. 27, even when a gap exists between the connecting portions 711 and 712 of adjacent main bodies 71, the intermediate member 74 can be attached to the connecting portions 711 and 712 by changing the position of the bolts 75 within the elongated holes 712a. Not the ceiling but the intermediate member 74 is seen through the gap between the main bodies 71, which provides a good appearance.

Figure 28:
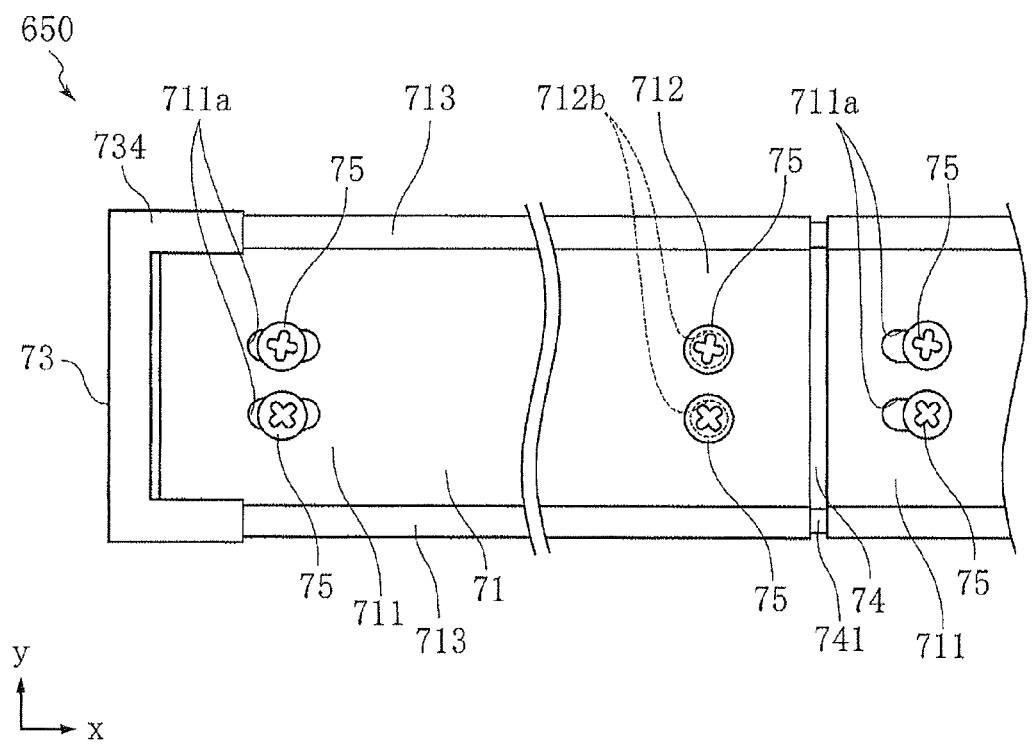
FIG. 28 shows a second variation of the lamp case.

FIG. 28 shows a second variation of the lamp case 650. In this variation, circular screw insertion holes 712b are provided instead of the elongated holes 712a. The structure of other parts is the same as that of the lamp case 650 shown in FIGS. 15-26. Similarly to FIG. 26, FIG. 28 shows the state in which the lamp cases 650 of this variation are aligned. As shown in FIG. 28, even when a gap exists between the connecting portions 711 and 712 of adjacent main bodies 71, the intermediate member 74 can be attached to the connecting portions 711 and 712 by changing the position of the bolts 75 within the elongated holes 711a. Not the ceiling but the intermediate member 74 is seen through the gap between the main bodies 71, which provides a good appearance. Adjustment can be achieved also by moving the end member 73 in direction x.

The LED lamp, lamp case and LED lighting apparatus according to the present invention are not limited to the foregoing embodiments. The specific structure of each part of the LED lamp, lamp case and LED lighting apparatus can be varied in design in many ways.

For instance, the number of the LED modules 2 and the interval between the LED modules 2 can be set appropriately. Although the LED modules 2 are arranged at regular intervals in the foregoing embodiments, the effectiveness of the present invention is maintained even when the LED modules 2 are arranged at irregular intervals, as long as the end cap 3 transmits and diffuses light. The positional relationship between the LED module 2 at an end in direction x and an end of the support member 11 in direction x is not limited to the condition described above. It is only necessary that the LED module at an end of the row in direction x is deviated toward an end of the support member in direction x such that an excessively large distance does not exist between the LED modules 2 of two adjacent LED lamps 501 at the joint portion in the LED lighting apparatus 601.

The lamp case 650 may be employed instead of the mounters 4 in the LED lighting apparatus 602-605. The LED lighting apparatuses 602-605 are designed on the assumption that a gap may be defined between the LED lamps 501-504. Accordingly, a gap may be defined between adjacent lamp cases 650. However, since the intermediate member 74 of the same color as that of the main body 71 is seen from the gap between the lamp cases 650, the LED lighting apparatus does not have a poor appearance.

Figure 29:
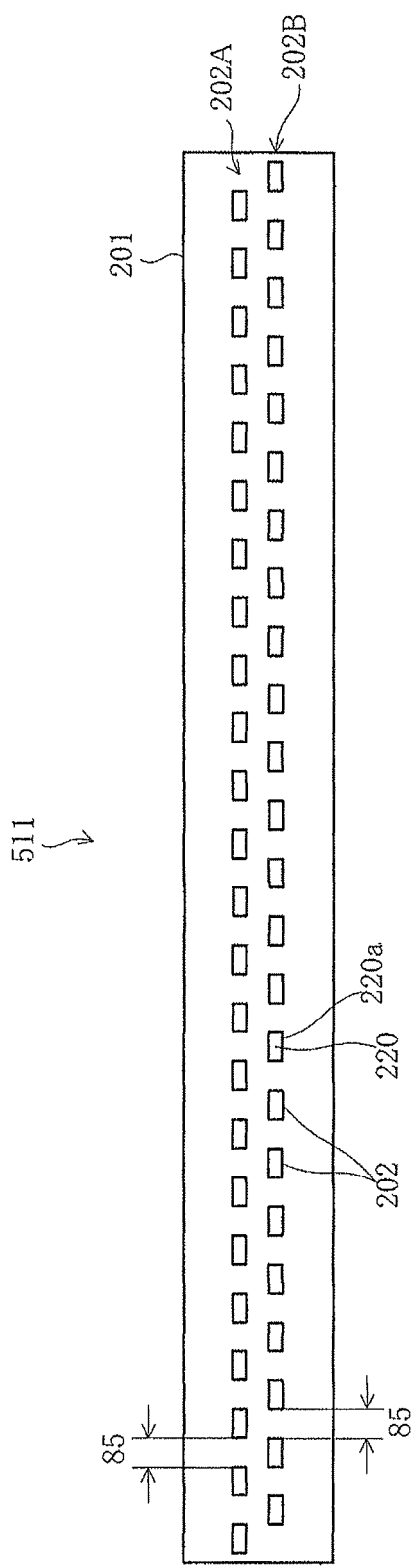
FIG. 29 is a plan view of a first embodiment of LED module according to the present invention.
Figure 30:
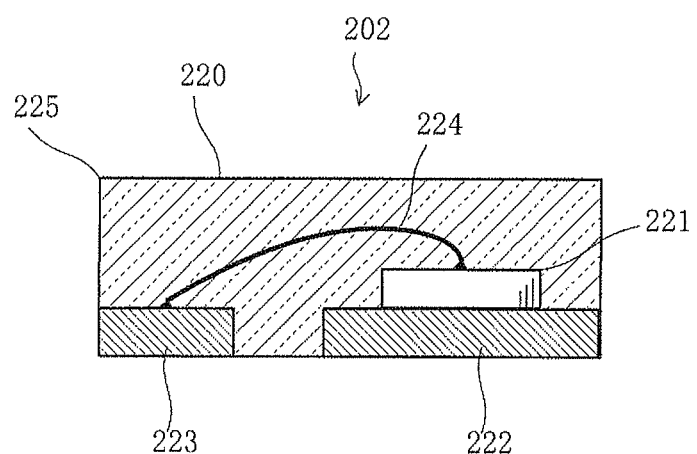
FIG. 30 is a sectional view showing a light emitting portion of the LED module shown in FIG. 29.

FIGS. 29 and 30 show an LED module according to a first, embodiment of the present invention. The LED module 511 of this embodiment includes a substrate 201 and a plurality of light emitting portions 202.

The substrate 201 is made of e.g. glass-fiber-reinforced epoxy resin and in the form of an elongated strip as shown in FIG. 29. The substrate 201 is about 200 mm in length and about 20 mm in width. Though not illustrated, the substrate 201 has an obverse surface formed with a wiring pattern for mounting the light emitting portions 202.

As shown in FIG. 29, the light emitting portions 202 are mounted on the obverse surface of the substrate 201 in two rows 202A and 202B extending in the longitudinal direction of the substrate 201. Each of the light emitting portions 202 has a light emission surface 220 that is in the form of an elongated rectangle as viewed in the thickness direction of the substrate 201 (perpendicularly to the sheet surface of FIG. 29). The light emitting portions 202 are so arranged that the longer side 220a of each light emission surface 220 extends in the longitudinal direction of the substrate 201. In each of the rows 202A and 202B, the light emitting portions 202 are arranged at regular intervals 85 in the longitudinal direction of the substrate 201. The interval 85 is substantially equal to the length of the longer side 220a of each light emission surface 220. The rows 202A and 202B are deviated from each other in the longitudinal direction of the substrate 201 by one half of the interval 85 such that the light emitting portions 202 are in staggered arrangement. Although the interval 85 is substantially equal to the length of the longer side 220a of the light emission surface 220 in this embodiment, the interval 85 can be made longer than the longer side 220a.

As shown in FIG. 30, each of the light emitting portions 202 includes an LED chip 221, a pair of metal leads 222 and 223 spaced from each other, a wire 224 and a resin package 225.

The LED chip 221 has e.g. a lamination structure made up of an n-type semiconductor layer, a p-type semiconductor layer and an active layer sandwiched between the semiconductor layers. The LED chip 221, if made of e.g. GaN-based semiconductor, emits blue light. The LED chip 221 is mounted on the lead 222. The upper surface of the LED chip 221 is connected to the lead 223 via the wire 224. The leads 222 and 223 are bonded to the wiring pattern on the substrate 201. The resin package 225 protects the LED chip 221 and the wire 224. The resin package 225 is made of e.g. epoxy resin that transmits light from the LED chip 221. The resin package 225 contains a fluorescent material that emits e.g. yellow light when excited by blue light. Thus, the light emitting portion 202 emits white light. The surface of the resin package 225 opposite to the surface facing the substrate 201 constitutes the light emission surface 220.

Figure 31:
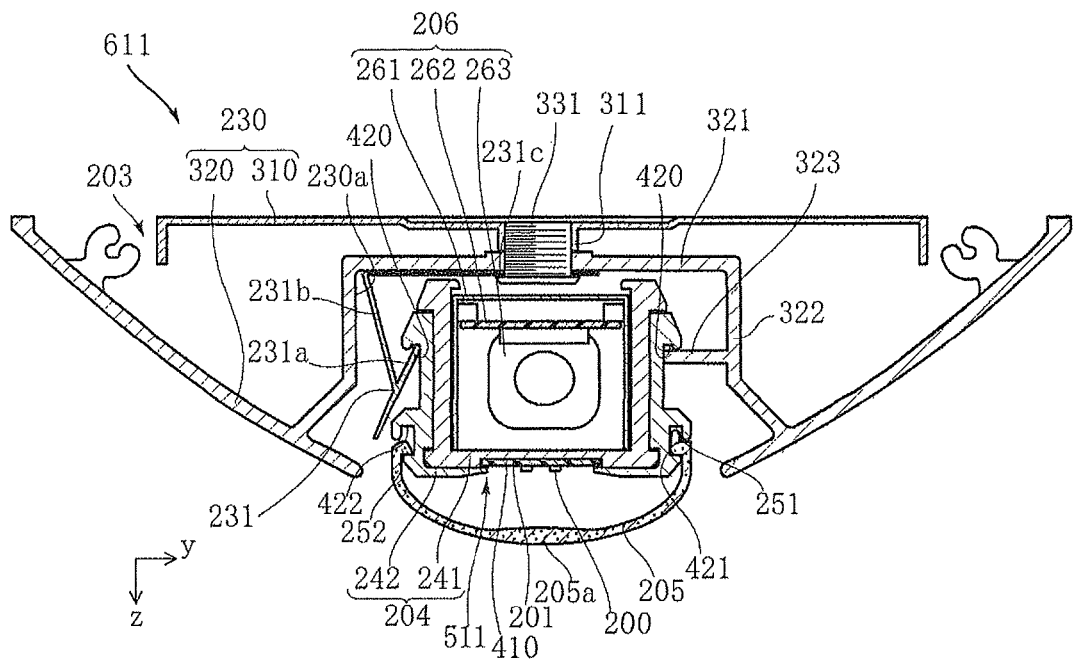
FIG. 31 is a sectional view of an LED lighting apparatus provided with the LED module shown in FIG. 29.
Figure 32:
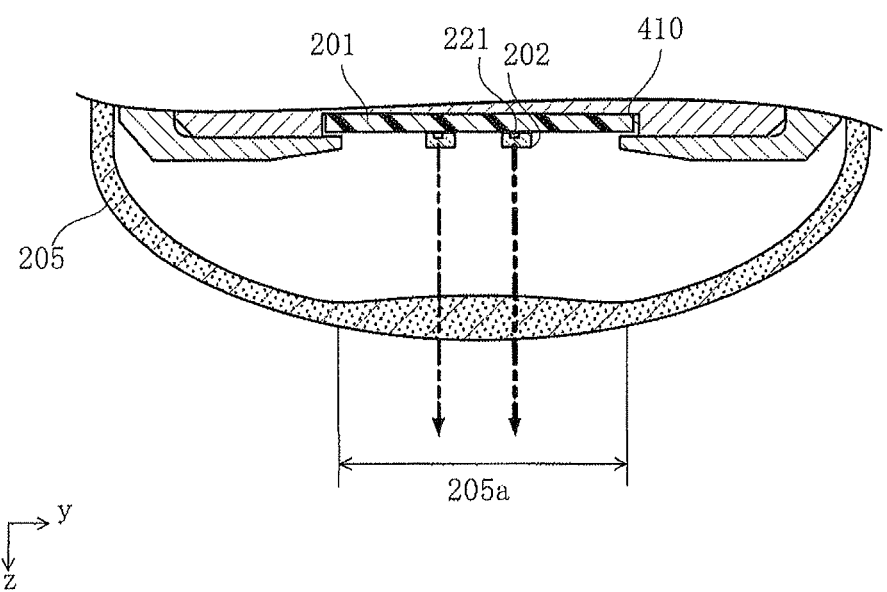
FIG. 32 is a sectional view of a principal portion of the LED lighting apparatus shown in FIG. 31.

FIGS. 31 and 32 shown an example of LED lighting apparatus provided with the LED module 511. The LED lighting apparatus 611 of this embodiment includes a plurality of LED modules 511, a mounter 203, a support member 204, a diffusion cover 205 and a power conversion unit 206. The LED lighting apparatus 611 is attached to e.g. a ceiling to illuminate the floor. The LED lighting apparatus 611 is elongated in the direction perpendicular to the sheet surface of these drawings.

As shown in FIG. 31, the mounter 203 includes a main body 230 and a plurality of holders 231. The main body 230 is elongated in the direction perpendicular to the sheet surface of the figure and is made of e.g. aluminum. The main body 230 has a recess 230a for receiving the LED modules 511. The main body 230 includes a curved surface having a continuous curvature across the recess 230a.

The main body 230 is made up of a base plate 310 and a wing 320. The base plate 310 is a plate elongated in the direction perpendicular to the sheet surface of FIG. 31 and having a width in direction y. The base plate 310 includes a plurality of projections 311. The edges of the base plate 310 that are spaced in direction y are bent downward in direction z to provide rigidity. The projections 311 project downward in direction z and are spaced from each other in the direction perpendicular to the sheet surface of FIG. 31. Each of the projections 311 is in contact with the wing 320.

The wing 320 is in the form of an umbrella as a whole when viewed in the direction perpendicular to the sheet surface of FIG. 31. The wing 320 includes a bottom plate 321, two walls 322 and a controlling portion 323 on the inside. The bottom plate 321 is parallel with the base plate 310. The two walls 322 stand in direction z on the edges of the bottom plate 321 that are spaced in direction y. The bottom plate 321 and the two walls 322 constitute the recess 230a for receiving the LED modules 511. On one of the walls 322 is provided a holder 231 comprising an elastic member. On the other one of the walls 322 is provided the controlling portion 323. The controlling portion 323 is in the form of a plate projecting in direction y from the wall 322 and perpendicular to the wall 322. For instance, the controlling portion 323 extends substantially along the entire length of the wing 320 in a direction perpendicular to the sheet surface of FIG. 31.

Each of the holders 231 is formed by e.g. bending a metal plate and includes an engagement piece 231a, a flexible portion 231b and a fixed portion 231c. As shown in FIG. 31, the engagement piece 231a is inclined to be away from the LED modules 511 in direction y as proceeding away from the bottom plate 321 in direction z. The flexible portion 231b is inclined to come closer to the LED modules 511 in direction y as proceeding away from the bottom plate 321 in direction z. The flexible portion 231b supports the engagement piece 231a at its one end and is connected to the fixed portion 231c at the other end. The flexible portion 231b is elastically bendable or deformable. The fixed portion 231c comprises a plate-like member provided on the bottom plate 321 in an overlapping manner. The fixed portion 231c is fastened to the wing 320 with screws 331. The plurality of holders 231 are aligned in the direction perpendicular to the sheet surface of FIG. 31.

As shown in FIG. 31, the support member 204 is provided for supporting the plurality of LED modules 511 and supplying electric power to the LED modules 511. The LED modules 511 are supported by the support member 204 as aligned in the longitudinal direction (the direction perpendicular to the sheet surface of FIG. 31).

The support member 204 includes a base portion 241 and a pair of outer portions 242. The base portion 241 and the outer portions 242 are made of e.g. aluminum. The base portion 241 is substantially U-shaped in cross section. The base portion 241 has a recess 410 at the outer surface of the bottom for attaching the substrate 201 of the LED module 511. The recess 410 is dented upward in direction z and receives the substrate 201. Each outer portion 242 is configured to cover most part of a side surface of the base portion 241 and one of edges of the substrate 201 which are spaced in direction y.

Each of the outer portions 242 is formed with an engagement groove 420. The engagement groove 420 extends in the direction perpendicular to the sheet surface of FIG. 31 and is dented in a direction opposite to the light emission direction of the LED modules 511 in direction z. The engagement groove 420 on one side engages the engagement piece 231a of the holder 231. The engagement groove 420 on the other side engages the controlling portion 323.

One of the outer portions 242 is further formed with an engagement groove 421. The engagement groove 421 extends in the direction perpendicular to the sheet surface of FIG. 31 and is dented in a direction opposite to the light emission direction of the LED modules 511 in direction z. The other one of the outer portions 242 is formed with an engagement groove 422. The engagement groove 422 also extends in the direction perpendicular to the sheet surface of FIG. 31 and is dented in a direction opposite to the light emission direction of the LED modules 511 in direction z.

As shown in FIGS. 31 and 32, the diffusion cover 205 is elongated in the direction perpendicular to the sheet surface of these figures and arcuate in cross section. The diffusion cover 205 is made of e.g. a milk-white resin that transmits the light from the LED modules 511 while diffusing the light. As shown in FIG. 31, the diffusion cover 205 has engagement portions 251 and 252 at the edges. The engagement portion 251 engages the engagement groove 421. The engagement portion 252 engages the engagement groove 422.

As shown in FIG. 32, the diffusion cover 205 includes a center region 205a having a predetermined width in direction y and having a center at a point directly below the LED module 511 in direction z. The width of the center region 205a in direction y is larger than the width in direction y of the region where the light emitting portions 202 are disposed in staggered arrangement. The center region 205a is an example of the strong diffusion region of the present invention.

The power conversion unit 206 has a function of converting e.g. commercial AC 100 V to DC 36 V, and is housed in the support member 204. The power conversion unit 206 includes a case 261, a power supply substrate 262 and a plurality of electronic components 263. The case 261 is substantially U-shaped in cross section and made of metal, for example. The case 261 is used for fixing the power conversion unit 206 to the base portion 241. The power supply substrate 262 is fixed to the case 261. The electronic components 263 are mounted on the power supply substrate 262. Examples of the electronic components 263 include a transformer, a rectifier and a transistor for constant-current control. A connector, not shown, extends from the power conversion unit 206. This connector is connected to a connector (not shown) attached to the mounter 203.

In this embodiment, a plurality of power conversion units 206 are provided, and electric power is applied from each power conversion unit 206 to the light emitting portions 202 of the plurality of LED modules 511. For instance, DC power of about 3 V and about 20 mA is supplied to each LED chip 221.

The advantages of the LED module 511 and the LED lighting apparatus 611 are described below.

In the LED module 511 of this embodiment, the plurality of light emitting portions 202 disposed in staggered arrangement form a light emission region spreading to a certain extent in the longitudinal direction and width direction of the substrate 201. Thus, the light from the light emission region is emitted while spreading to a certain extent not only in the longitudinal direction but also in the width direction of the substrate 201.

Further, in the light emission region, each light emitting portion 202 forming the row 202A is positioned between two adjacent light emitting portions 202 forming the other row 202B. Thus, the light from the row 202A is unlikely to overlap the light from the row 202B. Thus, the light emission region including the two rows 202A and 202B does not form a sharp brightness distribution but forms a brightness distribution gently spreading to a certain extent in the width direction of the substrate 201.

The light emission region does not look like a line of strong light but looks like a band of light having a certain width. Thus, the light from the light emitting portions 202 is not too glaring. In this way, with the LED module 511, the staggered arrangement of the light emitting portions 202 increases the total amount of light and achieves uniform brightness.

In the LED lighting apparatus 611 of this embodiment, a thicker portion of the diffusion cover 205 diffuses a larger amount of light and has a lower light transmittance. Thus, the center region 205a of the diffusion cover 205 has a lower light transmittance than other portions. For instance, the light transmittance at the center region 205a is about 75%, while the light transmittance at other portions is about 85%.

The distance between the diffusion cover 205 and the LED module 511 is smallest at the center region 205a and increases as proceeding away from the center region 205a in direction y. Thus, the light emitted from the LED module 511 and reaching the center region 205a is stronger than the light emitted from the LED module 511 and reaching other portions.

In the LED lighting apparatus 611, the center region 205a, to which relatively strong light reaches, is designed to have a relatively low light transmittance, so that the light emitted from the center region 205a and the light emitted from other portions have a substantially equal strength. Thus, in the LED lighting apparatus 611, non-uniformity in the light emitted from the diffusion cover 205 is suppressed during the lighting, and the dispersed arrangement of the light emitting portions 202 or the rows 202A, 202B of the light emitting portions cannot be observed. In this way, in the LED lighting apparatus 611, the diffusion cover 205 provides more uniform brightness and better appearance during the lighting.

Figure 33:
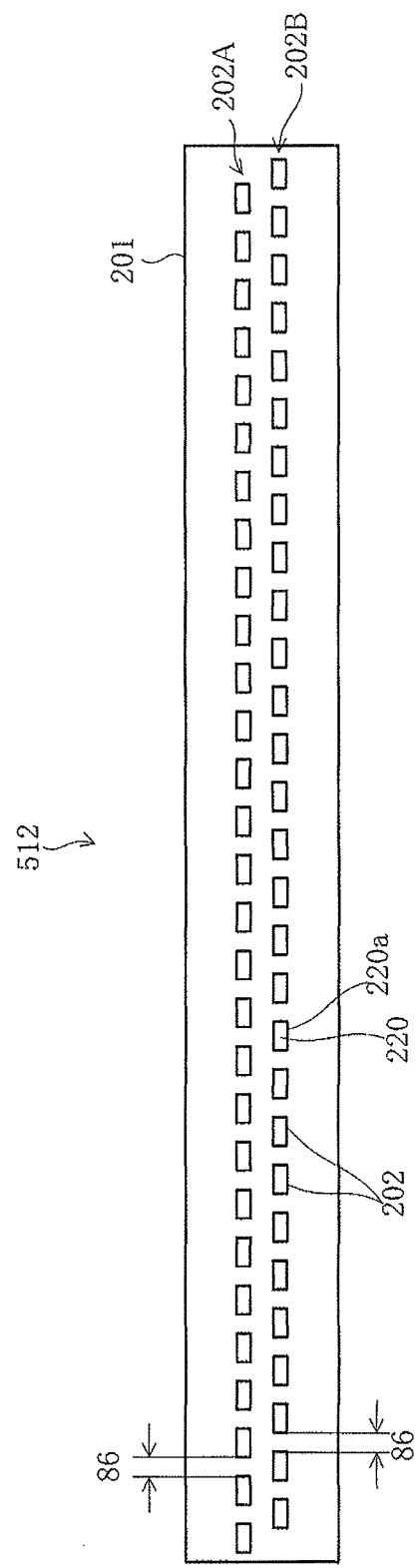
FIG. 33 is a plan view of a second embodiment of LED module according to the present invention.
Figure 34:
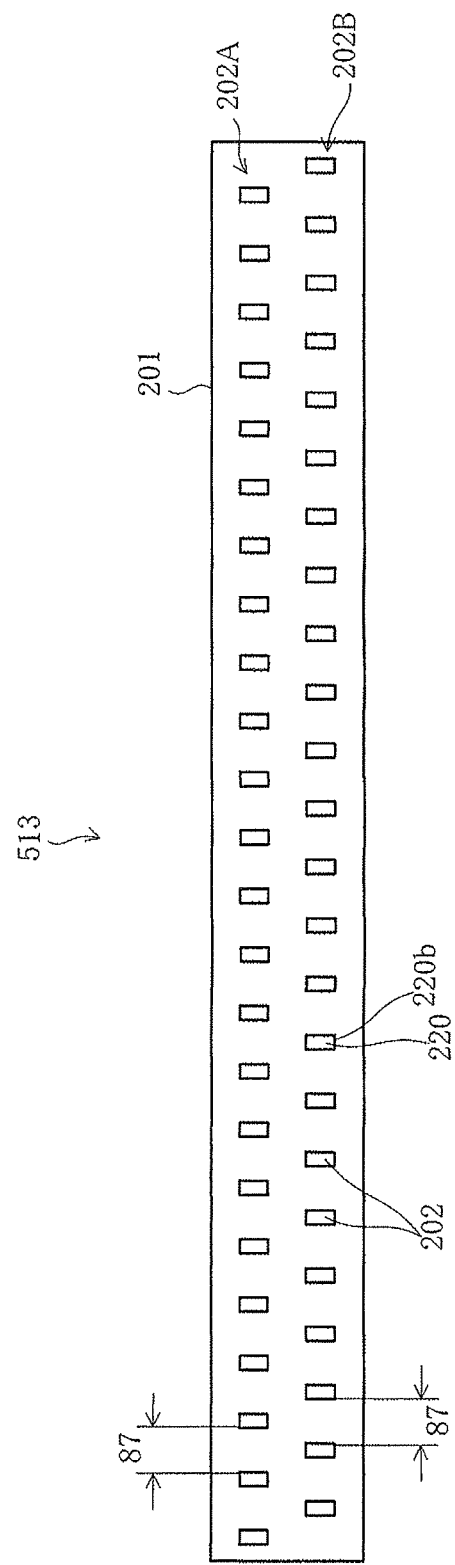
FIG. 34 is a plan view of a third embodiment of LED module according to the present invention.

FIGS. 33 and 34 show LED modules according to a second and a third embodiments of the present invention. FIGS. 35-38 show LED lighting apparatuses according to a fourth through a seventh embodiments of the present invention. In FIGS. 33-38, the elements that are identical or similar to those of the first embodiment are designated by the same reference signs as those used for the first embodiment, and the description is omitted.

In the LED module 512 according to the second embodiment shown in FIG. 33, the light emitting portions 202 in each of the rows 202A and 202B are aligned at regular intervals 86 in the longitudinal direction of the substrate 201. This interval 86 is smaller than the length of the longer side 220a of each light emission surface 220. The rows 202A and 202B are deviated from each other in the longitudinal direction of the substrate 201 by one half of the interval 86. With this arrangement, the light emitting portions 202 are in staggered arrangement with intervals smaller than that in the first embodiment, so that the number of light emitting portions 202 is larger than that of the first embodiment. Thus, this arrangement ensures that an increased amount of light is emitted from the entire LED module while achieving uniform brightness.

In the LED module 513 according to the third embodiment shown in FIG. 34, all the light emitting portions 202 are arranged such that the shorter side 220b of the light emission surface 220 extends in the longitudinal direction of the substrate 201. The light emitting portions 202 in each of the rows 202A and 202B are aligned in the longitudinal direction of the substrate 201 at regular intervals 87. The rows 202A and 202B are deviated from each other in the longitudinal direction of the substrate 201 by one half of the interval 87, so that the light emitting portions 202 are in staggered arrangement. With this structure, the interval 87 between the light emitting portions 202 in each of the rows 202A, 202B can be set appropriately in accordance with the directivity of the LED chips to achieve uniform brightness. Although the interval 87 is considerably larger than the shorter side 220b of the light emission surface 220 in this embodiment, the interval 87 may be smaller than the shorter side 220b. Such an arrangement allows a larger number of light emitting portions 202 to be disposed to achieve an increased amount of light emission.

Figure 35:
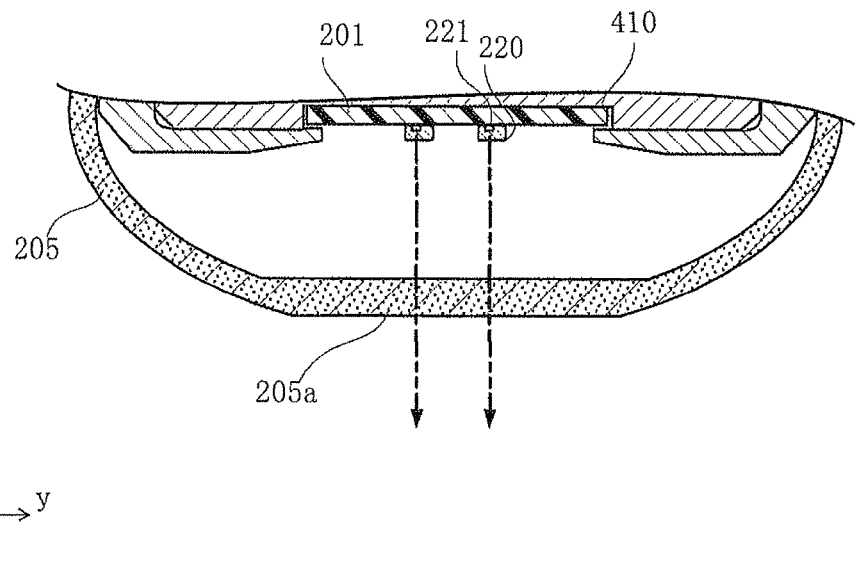
FIG. 35 is a sectional view showing a principal portion of a forth embodiment of LED lighting apparatus according to the present invention.

In the LED lighting apparatus according to the fourth embodiment shown in FIG. 35, the center region 205a of the diffusion cover 205 is in the form of a flat plate. The diffusion cover 205 having this shape can also suppress the non-uniformity of light emission through the diffusion cover 205.

Figure 36:
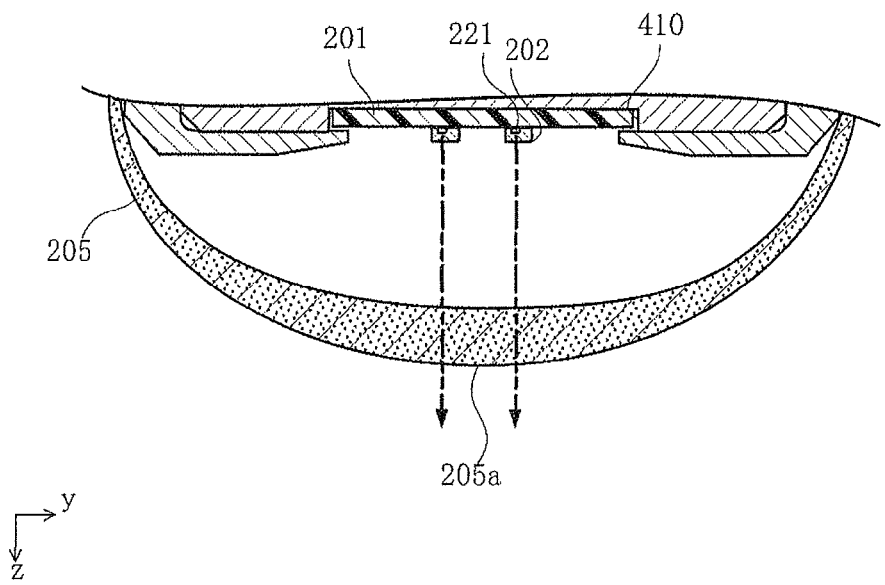
FIG. 36 is a sectional view showing a principal portion of a fifth embodiment of LED lighting apparatus according to the present invention.

In the LED lighting apparatus according to the fifth embodiment shown in FIG. 36, the thickness of the diffusion cover 205 increases as proceeding from each of the ends spaced in direction y toward the center. With this arrangement, the diffusion cover 205 is thicker at a portion closer to the LED module 511. This arrangement ensures that non-uniformity of light emission through the diffusion cover 205 is suppressed during the lighting of the LED lighting apparatus, which enhances the appearance of the LED lighting apparatus during the lighting.

Figure 37:
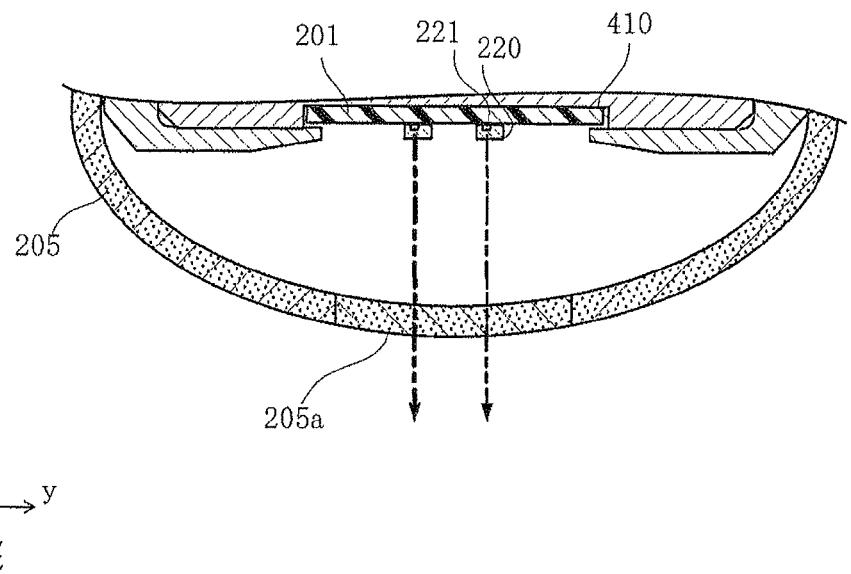
FIG. 37 is a sectional view showing a principal portion of a sixth embodiment of LED lighting apparatus according to the present invention.

In the LED lighting apparatus according to the sixth embodiment shown in FIG. 37, the diffusion cover 205 has a uniform thickness, and the center region 205a is made of a milk-white resin having a light transmittance lower than that of other portions. Specifically, the light transmittance of the diffusion cover 205 at portions other than the center region 205a is about 85%, whereas the light transmittance at the center region 205a is about 75%. Similarly to the diffusion covers of the foregoing embodiments, the diffusion cover 205 is also capable of suppressing non-uniformity of the light emission through the diffusion cover 205.

Figure 38:
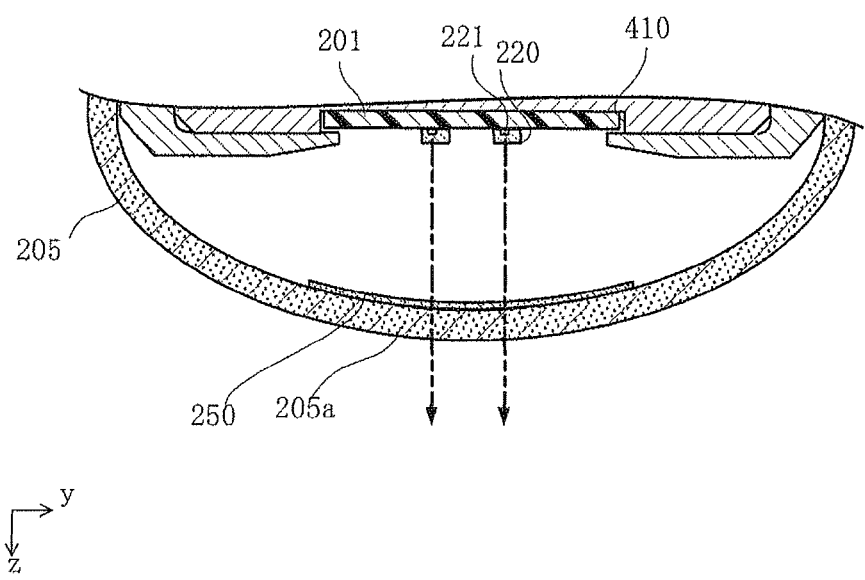
FIG. 38 is a sectional view showing a principal portion of a seventh embodiment of LED lighting apparatus according to the present invention.
Figure 39:
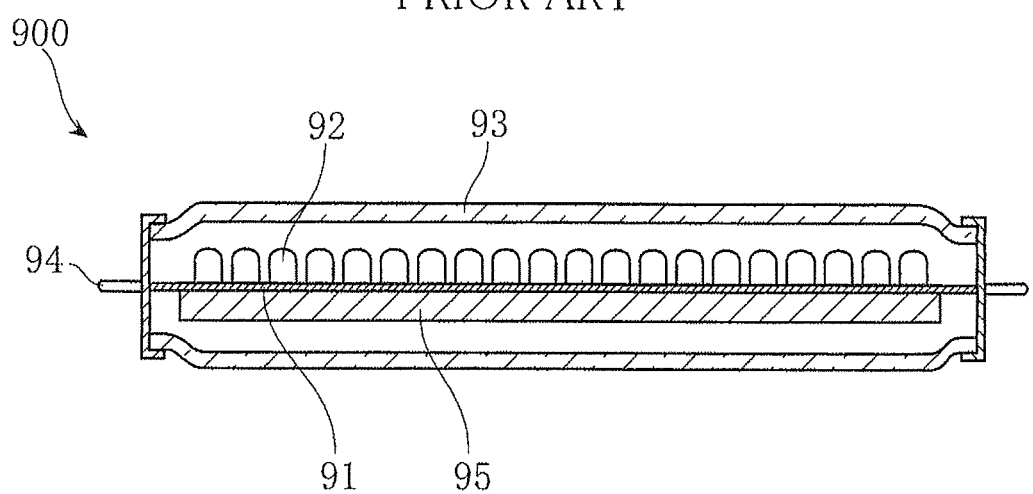
FIG. 39 is a sectional view showing an example of conventional LED lamp.

In the LED lighting apparatus according to the seventh embodiment shown in FIG. 38, the diffusion cover 205 has a uniform thickness. In this embodiment, a diffusion member 250 is provided to overlap the center region 205a. The light transmittance of the diffusion cover 205 at portions where the diffusion member 250 is not provided is about 85%. The diffusion member 250 is made of e.g. the same milk-white resin as that of the diffusion cover 205 and formed such that the center region 205a where the diffusion member 250 is laid on the diffusion cover 205 has a light transmittance of about 75%. The use of the diffusion cover 205 provided with this diffusion member 250 also suppresses the non-uniformity of the light emission through the diffusion cover 205. The use of the diffusion member 250 that is separate from the diffusion cover 205 allows the diffusion cover 205 to have a simple structure and hence to be made easily.

The LED module and the LED lighting apparatus according to the present invention are not limited to the foregoing embodiments. The specific structure of each part of the LED module and the LED lighting apparatus can be varied in design in many ways.

For instance, the LED module is not limited to the structure in which the light emitting portions are mounted on a substrate. Instead, LED chips may be directly mounted on a substrate. The substrate may not be in the form of an elongated strip but may be rectangular or circular. The light emitting portions may be in staggered arrangement made up of three or more rows.

As the LED chips, those that emit red light, green light and blue light may be employed. In this case, the LED lighting apparatus can be used for e.g. an electronic sign board or a display.

The LED lighting apparatus can employ the LED module according to the second or the third embodiment instead of that according to the first embodiment.

The invention claimed is:

1. An LED lamp comprising:
a plurality of LED modules arranged in a first direction;
a tubular enclosure for housing the LED modules, the tubular enclosure being open at ends spaced from each other in the first direction; and
end caps respectively closing the ends of the tubular enclosure;
wherein each of the end caps is configured to diffuse light from the LED modules while transmitting the light, the end cap including an emission surface for emitting light in a direction perpendicular to the first direction.

2. The LED lamp according to claim 1, wherein: the tubular enclosure includes a support member including a mount surface on which the LED modules are mounted, the mount surface being positioned on one side in a second direction perpendicular to the first direction, the tubular enclosure further including a diffusion cover for diffusing the light from the LED modules while transmitting the light, the diffusion cover covering the one side of the support member in the second direction; and
the emission surface is provided on the one side in the second direction.

3. The LED lamp according to claim 1, wherein each of the end caps is made of a transparent resin added with a light-diffusing material for diffusing light from the LED modules.

4. The LED lamp according to claim 2, wherein the emission surface is continuous with an outer surface of the diffusion cover.

5. The LED lamp according to claim 1, wherein: the LED modules are arranged at regular intervals; and
distance between each of the end caps and one of the LED modules that is closest in the first direction to the end cap is smaller than the interval.

6. The LED lamp according to claim 5, wherein a distance between an outer one of end surfaces of the end cap that are spaced in the first direction and the LED module that is closest in the first direction to the end cap is one half the interval.

7. The LED lamp according to claim 1, wherein: the end cap is provided with a connection plate projecting in the first direction into the tubular enclosure;
the connection plate is formed with a screw insertion hole elongated in the first direction; and
the end cap is attached to the tubular enclosure with a screw inserted into the screw insertion hole such that the emission surface can be accommodated in the tubular enclosure.

8. The LED lamp according to claim 1, wherein the end caps include a first end cap having an inclined surface inclined to be away from the emission surface as proceeding outward in the first direction and a second end cap having an inclined surface inclined to come close to the emission surface as proceeding outward in the first direction.

9. The LED lamp according to claim 1, wherein each of the end caps includes a male portion having an inclined surface inclined to come close to the emission surface as proceeding outward in the first direction and a female portion having an inclined surface inclined to be away from the emission surface as proceeding outward in the first direction.

10. An LED lighting apparatus comprising at least two LED lamps as set forth in claim 1 aligned in the first direction,
wherein an end, in the first direction, of one of the end caps of one of two adjacent LED lamps and an end, in the first direction, of one of the end caps of the other one of the two adjacent LED lamps face each other.

11. The LED lighting apparatus according to claim 10, wherein the end of the end cap of one of two adjacent LED lamps and the end of the end cap of the other one of the two adjacent LED lamps are in contact with each other.

12. The LED lighting apparatus according to claim 11, wherein the emission surfaces of the two adjacent LED lamps are continuous with each other.

13. The LED lighting apparatus according to claim 10, wherein: a plate member is disposed between and in contact with the end caps of the two adjacent LED lamps; and
the plate member is configured to diffuse light from the LED modules while transmitting the light.

14. The LED lighting apparatus according to claim 13, wherein the plate member includes a surface continuous with the emission surface of each of the end caps.

15. An LED lighting apparatus comprising at least two LED lamps as set forth in claim 7 aligned in the first direction,
wherein an end, in the first direction, of one of the end caps of one of two adjacent LED lamps and an end, in the first direction, of one of the end caps of the other one of the two adjacent LED lamps are in contact with each other.

16. An LED lighting apparatus comprising at least two LED lamps as set forth in claim 8 aligned in the first direction, wherein:
each of two adjacent LED lamps includes the first end cap and the second end cap at ends spaced from each other in the first direction; and
the inclined surface of the first end cap of one of the two adjacent LED lamps and the inclined surface of the second end cap of the other one of the two adjacent LED lamps face each other.

17. An LED lighting apparatus comprising at least two LED lamps as set forth in claim 9 aligned in the first direction,
wherein the female portion of one of the end caps of one of two adjacent LED lamps is in engagement with the male portion of one of the end caps of the other one of the two adjacent LED lamps.

18. An LED lighting apparatus comprising:
at least two LED lamps as set forth in claim 1 aligned in the first direction;
at least two lamp cases comprising a plurality of LED modules arranged in a first direction and a tubular enclosure for housing the LED modules, the lamp case comprising:
a main body including a pair of connecting portions at ends spaced from each other in the first direction; and
an end member to be attached to either one of the paired connecting portions;
wherein the end member is removably attachable to the connecting portions and includes a wall surface perpendicular to the first direction for housing the LED lamps; and
an intermediate member to be connected to both of two of the lamp cases that are adjacent to each other in the first direction;

wherein an end, in the first direction, of one of the end caps of one of two adjacent LED lamps and an end, in the first direction, of one of the end caps of the other one of the two adjacent LED lamps face each other.

19. The LED lighting apparatus according to claim 18, wherein the end of the end cap of one of two adjacent LED lamps and the end of the end cap of the other one of the two adjacent LED lamps are in contact with each other.

20. The LED lighting apparatus according to claim 19, wherein the emission surfaces of the two adjacent LED lamps are continuous with each other.

21. The LED lighting apparatus according to claim 18, wherein: a plate member is disposed between and in contact with the end caps of the two adjacent LED lamps; and
the plate member is configured to diffuse light from the LED modules while transmitting the light.

22. The LED lighting apparatus according to claim 21, wherein the plate member includes a surface continuous with the emission surface of each of the end caps.

23. An LED lighting apparatus comprising:
at least two LED lamps as set forth in claim 7 aligned in the first direction;
at least two lamp cases comprising a plurality of LED modules arranged in a first direction and a tubular enclosure for housing the LED modules, the lamp case comprising:
a main body including a pair of connecting portions at ends spaced from each other in the first direction; and
an end member to be attached to either one of the paired connecting portions;
wherein the end member is removably attachable to the connecting portions and includes a wall surface perpendicular to the first direction for housing the LED lamps; and
an intermediate member to be connected to both of two of the lamp cases that are adjacent to each other in the first direction;
wherein an end, in the first direction, of one of the end caps of one of two adjacent LED lamps and an end, in the first direction, of one of the end caps of the other one of the two adjacent LED lamps are in contact with each other.

24. An LED lighting apparatus comprising:
at least two LED lamps as set forth in claim 8 aligned in the first direction;
at least two lamp cases comprising a plurality of LED modules arranged in a first direction and a tubular enclosure for housing the LED modules, the lamp case comprising:
a main body including a pair of connecting portions at ends spaced from each other in the first direction; and
an end member to be attached to either one of the paired connecting portions;
wherein the end member is removably attachable to the connecting portions and includes a wall surface perpendicular to the first direction for housing the LED lamps; and
an intermediate member to be connected to both of two of the lamp cases that are adjacent to each other in the first direction, wherein:
each of two adjacent LED lamps includes the first end cap and the second end cap at ends spaced from each other in the first direction; and
the inclined surface of the first end cap of one of the two adjacent LED lamps and the inclined surface of the second end cap of the other one of the two adjacent LED lamps face each other.

25. An LED lighting apparatus comprising:
at least two LED lamps as set forth in claim 9 aligned in the first direction;
at least two lamp cases comprising a plurality of LED modules arranged in a first direction and a tubular enclosure for housing the LED modules, the lamp case comprising:
a main body including a pair of connecting portions at ends spaced from each other in the first direction; and
an end member to be attached to either one of the paired connecting portions;
wherein the end member is removably attachable to the connecting portions and includes a wall surface perpendicular to the first direction for housing the LED lamps; and
an intermediate member to be connected to both of two of the lamp cases that are adjacent to each other in the first direction,
wherein the female portion of one of the end caps of one of two adjacent LED lamps is in engagement with the male portion of one of the end caps of the other one of the two adjacent LED lamps.

* * * * *